(12) United States Patent  (10) Patent No.: US 6,313,641 B1
Brooks  (45) Date of Patent: Nov. 6, 2001

(54) METHOD AND SYSTEM FOR DETECTING ARCING FAULTS AND TESTING SUCH SYSTEM

(75) Inventor: Stanley J. Brooks, Rockvale, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/345,940

(22) Filed: Jul. 1, 1999

Related U.S. Application Data

(63) Continuation-in-part of application No. 08/788,969, filed on Jan. 24, 1997, which is a continuation-in-part of application No. 08/794,848, filed on Feb. 4, 1997, now Pat. No. 6,034,611, which is a continuation-in-part of application No. 08/799,095, filed on Feb. 11, 1997, now Pat. No. 5,825,598, which is a continuation-in-part of application No. 08/403,084, filed on Mar. 13, 1995, now abandoned.

(51) Int. Cl.[7] ................................................. G01R 31/08

(52) U.S. Cl. .............................. 324/536; 324/424; 361/2; 361/7

(58) Field of Search .................................. 324/424, 422, 324/536, 529, 522; 361/2, 7, 45

(56) References Cited

U.S. PATENT DOCUMENTS

| H536 | 10/1988 | Strickland et al. ................... 324/456 |
| 30,678 | 11/1860 | Van Zeeland et al. ................ 361/44 |
| 2,808,566 | 10/1957 | Douma .................................. 324/127 |

(List continued on next page.)

FOREIGN PATENT DOCUMENTS

| 2256208 | 6/1999 | (CA) . |
| 2256243 | 6/1999 | (CA) . |
| 2265204 | 12/1999 | (CA) . |

(List continued on next page.)

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated 3 dB Couplers, RF Design, Feb., 1986, pp. 62–64.

(List continued on next page.)

*Primary Examiner*—Safet Metjahic
*Assistant Examiner*—Vincent Q. Nguyen
(74) *Attorney, Agent, or Firm*—Kareem M. Irfan; Larry I. Golden

(57) ABSTRACT

A system for detecting arcing faults in an electrical distribution network having a line conductor carrying an electrical signal between a power source and a load, the system being capable of detecting series arcs, line-to-neutral arcs and line-to-ground arcs. The system includes a sensor coupled to the line conductor for monitoring the electrical signal and generating a sensor signal representing the electrical signal. The system generates an arc-indicative signal in response to the sensor signal having characteristics indicative of an arcing fault. The system can include a testing system in which a test wire is coupled to the sensor simultaneously with the line conductor and a test signal is periodically produced on the test line. The sensor simultaneously monitors the test signal and the electrical signal and produces a sensor signal representing both the test signal and the electrical signal when the test signal is present on the test line. The arcing fault detection system generates an arc-indicative signal in response to the sensor signal associated with either the test line or line conductor having characteristics indicative of an arcing fault. A diagnostic test integrator evaluates the status conditions of the test signal and the arc-indicative signal and generates a trip signal to trigger the interruption of the electrical signal in response to certain status conditions of the test signal and the arc-indicative signal.

37 Claims, 20 Drawing Sheets

U.S. PATENT DOCUMENTS

| | | | |
|---|---|---|---|
| 2,832,642 | 4/1958 | Lennox | 299/132 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |
| 3,660,721 | 5/1972 | Baird | 361/55 |
| 3,684,955 | 8/1972 | Adams | 324/72 |
| 3,716,757 | 2/1973 | Rodriguez | 317/40 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,932,790 | 1/1976 | Muchnick | 317/18 D |
| 3,939,410 | 2/1976 | Bitsch et al. | 324/72 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,166,260 | 8/1979 | Gillette | 335/20 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,344,100 | 8/1982 | Davidson et al. | 361/45 |
| 4,347,414 | 8/1982 | Headley et al. | |
| 4,354,154 | 10/1982 | Olsen | 324/51 |
| 4,355,220 | 10/1982 | Parry | |
| 4,356,443 | 10/1982 | Emery | 324/51 |
| 4,369,364 | 1/1983 | Kunterman | |
| 4,378,525 | 3/1983 | Burdick | 324/127 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,477,855 | 10/1984 | Nakayama et al. | 361/54 |
| 4,539,448 | 9/1985 | Schulz | |
| 4,587,588 | 5/1986 | Goldstein | 361/54 |
| 4,616,200 | 10/1986 | Fixemer et al. | 335/35 |
| 4,631,621 | 12/1986 | Howell | 361/13 |
| 4,639,817 | 1/1987 | Cooper et al. | 361/62 |
| 4,642,733 | 2/1987 | Schacht | |
| 4,644,439 | 2/1987 | Taarning | 361/87 |
| 4,652,867 | 3/1987 | Oscar Masot | 340/638 |
| 4,658,322 | 4/1987 | Rivera | 361/37 |
| 4,697,055 | 9/1987 | Walter et al. | |
| 4,697,218 | 9/1987 | Nicolas | 633/882 |
| 4,702,002 | 10/1987 | Morris et al. | 29/837 |
| 4,707,759 | 11/1987 | Bodkin | 831/642 |
| 4,723,187 | 2/1988 | Howell | 361/13 |
| 4,771,355 | 9/1988 | Emery et al. | 361/33 |
| 4,810,954 | 3/1989 | Fam | 324/142 |
| 4,816,958 | 3/1989 | Belbel et al. | 361/93 |
| 4,833,564 | 5/1989 | Pardue et al. | 361/93 |
| 4,835,648 | 5/1989 | Yamauchi | 361/14 |
| 4,839,600 | 6/1989 | Kuurstra | 324/127 |
| 4,845,580 | 7/1989 | Kitchens | 361/91 |
| 4,847,719 | 7/1989 | Cook et al. | 361/5 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,878,144 | 10/1989 | Nebon | 361/96 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,168,261 | 12/1992 | Weeks | |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | |
| 5,307,230 | 4/1994 | MacKenzie | 361/96 |
| 5,334,939 | 8/1994 | Yarbrough | |
| 5,353,014 | 10/1994 | Carroll et al. | 340/638 |
| 5,359,293 | 10/1994 | Boksiner et al. | 324/544 |
| 5,363,269 | 11/1994 | McDonald | |
| 5,383,084 | 1/1995 | Gershen et al. | 361/113 |
| 5,388,021 | 2/1995 | Stahl | 361/56 |
| 5,420,740 | 5/1995 | MacKenzie et al. | 361/45 |
| 5,434,509 * | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,452,222 | 9/1995 | Gray et al. | 364/481 |
| 5,452,223 | 9/1995 | Zuercher et al. | 364/483 |
| 5,459,630 * | 10/1995 | MacKenzie et al. | 361/45 |
| 5,473,494 | 12/1995 | Kurosawa et al. | 361/3 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,499,189 | 3/1996 | Seitz | 364/480 |
| 5,506,789 | 4/1996 | Russell et al. | 364/492 |
| 5,510,946 | 4/1996 | Franklin | |
| 5,512,832 | 4/1996 | Russell et al. | 324/522 |
| 5,519,561 | 5/1996 | Mrenna et al. | 361/105 |
| 5,537,327 | 7/1996 | Snow et al. | 364/483 |
| 5,546,266 | 8/1996 | Mackenzie | 361/93 |
| 5,561,605 | 10/1996 | Zuercher et al. | 364/483 |
| 5,568,371 | 10/1996 | Pitel et al. | 363/39 |
| 5,574,624 | 11/1996 | Rennie et al. | |
| 5,578,931 | 11/1996 | Russell et al. | 324/536 |
| 5,590,010 | 12/1996 | Ceola et al. | 361/93 |
| 5,590,012 | 12/1996 | Charles Dollar | 361/113 |
| 5,602,709 | 2/1997 | Al-Dabbagh | 361/85 |
| 5,608,328 | 3/1997 | Sanderson | 324/529 |
| 5,617,019 | 4/1997 | Etter | 324/117 |
| 5,638,244 | 6/1997 | Mekanik et al. | 361/62 |
| 5,642,052 | 6/1997 | Earle | 324/556 |
| 5,657,244 | 8/1997 | Seitz | 364/492 |
| 5,659,453 | 8/1997 | Russell et al. | 363/89 |
| 5,661,645 | 8/1997 | Hochstein | 363/89 |
| 5,682,101 * | 10/1997 | Brooks et al. | 324/536 |
| 5,691,869 | 11/1997 | Engel et al. | 324/536 |
| 5,710,513 | 1/1998 | March | 324/424 |
| 5,729,145 | 3/1998 | Blades | 324/536 |
| 5,764,125 | 6/1998 | May | 336/92 |
| 5,805,397 | 9/1998 | MacKenzie | 361/42 |
| 5,805,398 | 9/1998 | Rae | 361/42 |
| 5,812,352 | 9/1998 | Rokita et al. | 361/58 |
| 5,815,352 | 9/1998 | Mackenzie | 361/42 |
| 5,818,237 | 10/1998 | Zuercher et al. | 324/536 |
| 5,818,671 | 10/1998 | Seymour et al. | 361/42 |

| | | | |
|---|---|---|---|
| 5,825,598 | 10/1998 | Dickens et al. | 361/42 |
| 5,834,940 | 11/1998 | Brooks et al. | 324/424 |
| 5,835,319 | 11/1998 | Welles, II et al. | 361/5 |
| 5,835,321 | 11/1998 | Elms et al. | 361/45 |
| 5,839,092 | 11/1998 | Erger et al. | 702/58 |
| 5,847,913 | 12/1998 | Turner et al. | 361/93 |
| 5,886,861 | 3/1999 | Parry | 361/42 |
| 5,889,643 | 3/1999 | Elms | 361/42 |
| 5,896,262 | 4/1999 | Rae et al. | 361/94 |
| 5,905,619 | 5/1999 | Jha | 361/93 |
| 5,933,305 | 8/1999 | Schmalz et al. | 361/42 |
| 5,933,308 | 8/1999 | Garzon | 361/62 |
| 5,946,179 | 8/1999 | Flege et al. | 361/93 |
| 5,963,406 | 10/1999 | Neiger et al. | 361/42 |
| 5,969,920 | 10/1999 | MacKenzie | 361/42 |
| 5,982,593 | 11/1999 | Kimblin et al. | 361/42 |
| 6,002,561 | 12/1999 | Dougherly | 361/42 |
| 6,031,699 | 2/2000 | Dollar, II et al. | 361/142 |
| 6,040,967 | 3/2000 | DiSalvo | 361/142 |

FOREIGN PATENT DOCUMENTS

| | | |
|---|---|---|
| 0502393A2 | 2/1992 | (EP) . |
| 0 615 327 | 9/1994 | (EP) ............... H02H/1/00 |
| 0 649 207 A1 | 4/1995 | (EP) . |
| 0 748 021 A1 | 12/1996 | (EP) . |
| 0 762 591 A2 | 3/1997 | (EP) . |
| 0911937A2 | 9/1998 | (EP) . |
| 0945949A2 | 9/1999 | (EP) . |
| RP0954003A2 | 11/1999 | (EP) . |
| 0974995A | 1/2000 | (EP) . |
| 0981193A | 2/2000 | (EP) . |
| 2215149A | 9/1989 | (GB) . |
| 0158365 | 6/2000 | (JP) . |
| WO 92/08143 | 5/1992 | (WO) . |

OTHER PUBLICATIONS

RV4145 Low Power Ground Fault Interrupter, Preliminary Product Specifications of Integrated Circuits, Raytheon Company Semiconductor Division, 350 Ellis Street, Mountain View CA 94309–7016, pp. 1–8.

Jean–Francois Joubert, Feasibility of Main Service Ground––Fault Protection On the Electrical Service To Dwelling Units, Consultants Electro–Protection Ins., 1980, Michelin St., Laval, Quebec H7L 9Z7. Oct. 26, 1990, pp. 1–77.

B.D. Russell, Detection Of Arcing Faults On Distribution Feeders, Texas A & M Research Foundation, Box H. College Station, Texis 77843, Final Report Dec., 1982, pp. 1–B18.

JP 0630819, dated Apr. 11, 1994, Abstract.

* cited by examiner-

METHOD AND SYSTEM FOR DETECTING ARCING FAULTS AND TESTING SUCH SYSTEM

CROSS REFERENCE TO RELATED APPLICATIONS

This application is a continuation-in-part of pending U.S. patent applications Ser. No. 08/788,969, filed Jan. 24, 1997, which is a continuation-in-part of abandoned U.S. patent application Ser. No. 08/403,084, filed Mar. 13, 1995 now abandoned; Ser. No. 08/794,848, filed Feb. 4, 1997 now U.S. Pat. No. 6,034,611, and Ser. No. 08/799,095, filed Feb. 11, 1997 now U.S. Pat. No. 5,825,598. The parent applications have the same assignee as the present invention and are incorporated herein by reference in their entirety.

FIELD OF THE INVENTION

The present invention relates generally to arcing fault detection systems for protecting an electrical distribution system from arcing faults. More particularly, the present invention relates to an apparatus and method for detecting series arcs, line-to-neutral arcs and line-to-ground arcs and to a test system and method for testing said detection system.

BACKGROUND OF THE INVENTION

Electrical systems in residential, commercial and industrial applications usually include a panelboard for receiving electrical power from a utility source. The power is connected to the panelboard via line bus bars and neutral bus bars. The electrical power is delivered from the panelboard to designated branch circuits through line and neutral conductors supplying one or more loads. Typically, various types of protective devices are mounted to the bus bars of the panelboard to protect the branch circuits from hazardous electrical conditions and reduce the risk of injury, damage or fires.

Standard circuit breakers are one type of protective device for protecting the branch circuits from certain hazardous electrical conditions. In particular, standard circuit breakers are designed to trip open and interrupt an electric circuit in response to detecting overloads and short circuits. Overload protection is provided by a thermal element which, when heated by the increased current, will cause the circuit breaker to trip and interrupt the power. This can occur when too many loads draw power from the same branch circuit at the same time, or when a single load draws more power than the branch circuit is designed to carry. Short circuit protection is provided by an electromagnetic element that trips when sensing high current flow.

An arcing fault detector is another type of protective device, designed to protect an electrical distribution system from hazardous electrical arc faults, or "arcing faults," which are one of the major sources of fires in residences. Arcing faults occur when electric current "arcs" or luminously discharges across an insulating medium, usually an ionized gas, between conductors. Some specific causes of arcing faults include: loose or improper connections, frayed or ruptured appliance or extension cords, pinched or pierced insulation of construction wire or extension cords, cracked insulation on wire or cords from age, heat, corrosion or bending stress, overheated or overloaded wires or cords and insulation break down in appliances.

Temperatures at the center of an arc can exceed 5000° F. and ignite the conductor insulation and adjacent combustible materials and/or melt the conductor itself (e.g., copper, having a melting temperature of 1980° F.). At a residential voltage of 120 Vac, an arc may be sustained continuously if it is tracking across a surface that is at least partially conductive. For example, the electrical insulation between conductors, over time, can carbonize thereby forming a conductive path that can sustain an arc which can start a fire. Quite often arcs are not sustained continuously, but rather comprise "sputtering arcs" that strike intermittently, extinguish, and strike again. As they sputter, they may eject small molten particles of conductor metal. Fires can be caused from the molten particles or the heat from the arc.

There are three general types of arcing faults: series arcs, line-to-neutral arcs and line-to-ground arcs. Series arcs are those which occur between two ends of a single conductor. For example, series arcs might result from a frayed conductor in a cord which has been pulled apart, or from a loose connection at a receptacle or in a splice.

Line-to-neutral arcs are short circuits which occur between line and neutral conductors of an electrical distribution system. For example, line-to-neutral arcs might result from a cord whose insulation which has been cut by a staple, or from an object, such as a piece of furniture being placed on it. Line-to-ground arcs are those which occur between a line conductor and a grounded conductor, in a three-wire system. Line-to-ground arcs will not occur in a two-wire appliance or extension cord. It should be noted that there are no "neutral-to-ground arcs" because, although electrical faults may occur between a neutral conductor and ground, the level of current is not high enough to produce an arc.

Generally, standard circuit breakers might detect certain types of arcing faults but can not detect all three types of arcing faults. For example, circuit breakers generally will not detect series arcs, because the current in a series arc is limited by the load it serves and is not usually high enough to trip the thermal or electromagnetic elements associated with standard circuit breakers. Similarly, standard circuit breakers quite often will not detect line-to-neutral arcs because, if the circuit has an impedance which is relatively high, the short-circuit current will be well below the level which would cause the standard circuit breaker to trip. Finally, unless the circuit breaker has a built-in ground fault detection capability, it will not be able to detect line-to-ground arcs.

Standard circuit breakers equipped with a ground-fault detection capability (hereinafter referred to as standard "GFI" circuit breakers) usually include a sensing coil for sensing the differential current between the line and neutral conductors. In the absence of a ground fault, the currents in the line and neutral conductors are equal and opposite and the sensing coil does not detect a differential current. When a ground fault occurs, which might result from current flowing from the line conductor to ground or from the neutral conductor to ground, the sensing coil detects a differential current and will cause the ground fault circuit breaker to trip if the current exceeds a predetermined threshold.

The standard GFI circuit breaker may or may not be able to detect line-to-ground arcs, depending on the trip threshold. In residential applications, for example, the trip threshold of a standard GH breaker is normally very low, on the order of 5–6 mA, which is sufficiently low to detect practically any line-to-ground arcs. In commercial or industrial applications, however, the trip threshold of the standard GFI breaker can be much higher, up to hundreds and thousands of Amps, in which case many line-to-ground faults will fall below the threshold and be undetected. In any case, even though standard GFI circuit breakers might detect some line-to-ground arcs, they generally will not detect series arcs or line-to-neutral arcs for the reasons heretofore stated.

Accordingly, there is a need for an arcing fault protection system which provides protection against arcing faults, preferably series arcs, line-to-neutral arcs and line-to-grounds arcs, at current levels which do not trip standard or standard GFI circuit breakers. Preferably, such system should detect all three of the aforementioned faults with a single sensor coupled to the line conductor. There is also a need for a system and method for testing such detection system, which test system preferably uses a test wire coupled to the same sensor coupled to the line conductor. The present invention is directed to addressing these needs.

SUMMARY OF THE INVENTION

In accordance with one aspect of the present invention, there is provided an arcing fault detection system and method for an electrical distribution network having a line and neutral conductor connected between a power source and a load. The arcing fault detection system includes a sensor coupled to the line conductor for monitoring a first derivative of electrical current carried by the line conductor and generating a sensor signal representing said first derivative of electrical current. An arc-indicative signal is generated in response to the sensor signal having characteristics indicative of an arcing fault selected from the group consisting of series arcs, line-to-neutral arcs and line-to-ground arcs.

In accordance with another aspect of the present invention, there is provided an arcing fault detection and testing system for an electrical distribution network having a line and neutral conductor connected between a power source and a load. The system includes a sensor coupled to the line conductor for monitoring a first derivative of electrical current carried by the line conductor and generating a sensor signal representing said first derivative of electrical current. The system also includes a test wire coupled to the sensor and means for producing a test signal on the test wire simulating an arcing fault. An arc-indicative signal is generated in response to either of the sensor signal and test signal having characteristics indicative of an arcing fault selected from the group consisting of series arcs, line-to-neutral arcs and line-to-ground arcs.

In accordance with still another aspect of the present invention, there is provided a testing apparatus for an arcing fault detection system in an electrical distribution network having a line and neutral conductor carrying an electrical signal between a power source and a load. The testing apparatus comprises a test circuit removably attachable to said line the neutral conductor, which test circuit is adapted to produce a simulated arcing fault signal when attached to the line and neutral conductor. The simulated arcing fault signal is detectable by an arcing fault detection system having a sensor for monitoring the line or neutral conductor, which system may produce an arc-indicative signal in response to the simulated arcing fault signal having characteristics indicative of an arcing fault.

In accordance with yet another aspect of the present invention, there is provided a circuit protection system adapted for installation in an electrical distribution panelboard, the panelboard receiving and distributing power from a utility source to a plurality of branch circuits each defining line and neutral conductors connected to a load. The circuit protection system includes an arcing fault detection device connected to a first position in the panelboard, the arcing fault detection device including an internal line conductor electrically connected to the line conductor of one of the branch circuits. A sensor coupled to the internal line conductor monitors a first derivative of electrical current carried by the internal line conductor and generates a sensor signal representing said first derivative, and an arc-indicative signal is generated in response to the sensor signal having characteristics indicative of an arcing fault selected from the group consisting of series arcs, line-to-neutral arcs and line-to-ground arcs. A line interrupter interrupts electrical current in the line conductor in response to the arc-indicative signal.

In accordance with still yet another aspect of the present invention, there is provided a circuit protection system adapted for installation in an electrical distribution panelboard, the panelboard receiving and distributing power from a utility source to a plurality of branch circuits each defining line and neutral conductors connected to a load. The circuit protection system includes an arcing fault detection device connected to a first position in the panelboard, the arcing fault detection device including an internal line conductor electrically connected to the line conductor of one of the branch circuits. A sensor coupled to the internal line conductor monitors a first derivative of electrical current carried by the internal line conductor and generates a sensor signal representing said first derivative. A test wire coupled to the sensor periodically carries a test signal simulating an arcing fault. An arc-indicative signal is generated in response to the either the sensor signal or test signal having characteristics indicative of an arcing fault selected from the group consisting of series arcs, line-to-neutral arcs and line-to-ground arcs. A line interrupter interrupts electrical current in the line conductor in response to the arc-indicative signal.

BRIEF DESCRIPTION OF THE DRAWINGS

In the drawings, which comprise a portion of this disclosure.

DETAILED DESCRIPTION OF SPECIFIC EMBODIMENTS

Figure 1:
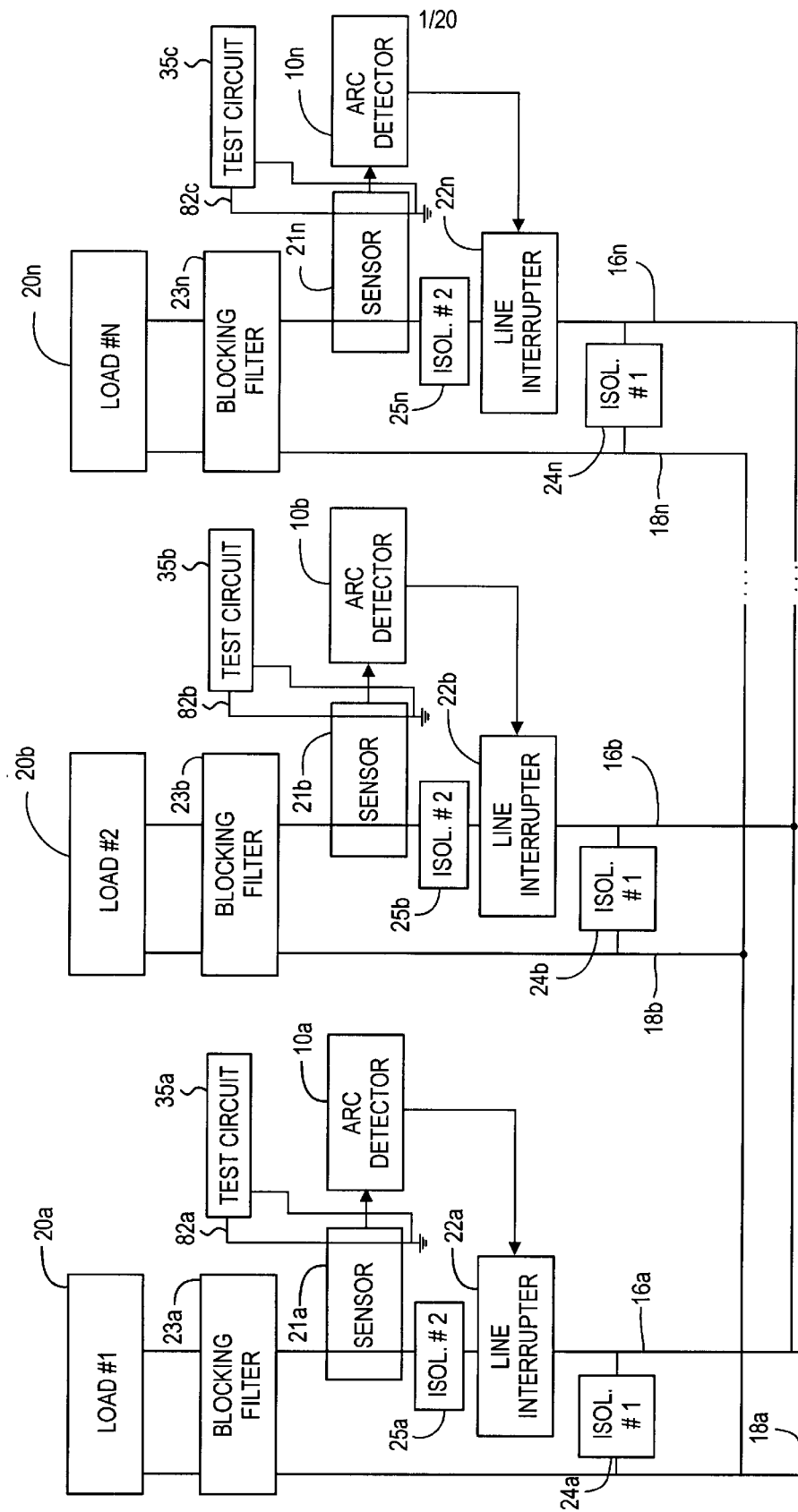
FIG. 1 is a block diagram of an arcing fault detection system having a sensor connected to the line conductor of a branch circuit.

While the invention is susceptible to various modifications and alternative forms, specific embodiments have been shown by way of example in the drawings and will be described in detail herein. However, it should be understood that the invention is not intended to be limited to the particular forms disclosed. Rather, the intention is to cover all modifications, equivalents, and alternatives falling within the spirit and scope of the invention as defined by the appended claims.

The present invention provides in one aspect a system which may be installed in residences, commercial and/or industrial buildings to guard against fires which may be caused by hazardous electrical arc faults, or "arcing faults." The system uses arcing fault detector(s) which can detect different types of arcing faults, namely series arcs, line-to-neutral arcs and line-to-ground arcs which generally can not be detected by a standard or GFI circuit breakers.

Most residences, commercial and/or industrial buildings include a panelboard for receiving electrical power from a utility source. Electrical power is distributed from the panelboard to various branch circuits having line and neutral conductors. Generally, the system of the present invention detects arcing faults by monitoring the current or voltage in the branch circuits and evaluating the current or voltage for characteristics of arcing faults. In a preferred embodiment, the system of the present invention is installed within the panelboard and uses a single sensor coupled to the line conductor. The single sensor is able to detect series arcs, line-to-neutral arcs and line-to-ground arcs because each of these types of arcs will affect the current carried by the line conductor in a manner which can be detected by the sensor.

The single sensor in one embodiment monitors the first derivative (di/dt) of electrical current carried by the line conductor and generates a sensor signal representing said first derivative of electrical current. The arcing fault detection system generates an arc-indicative signal signal if the first-derivative signal has characteristics indicative of a series arc, line-to-neutral arc or line-to-ground arc. The system of the present invention, using a single sensor, is generally less expensive to manufacture and requiresless space than competing systems using multiple sensors.

Turning now to the drawings and referring initially to FIG. 1, there will be described a specific embodiment of the present invention. Arcing fault detectors $10a, 10b \ldots 10n$ are connected to n branches of an electrical distribution system 12 having a utility company power transformer 14 as a source of electric power. The electrical distribution system 12 includes line conductors $16a, 16b \ldots 16n$ and neutral conductors $18a, 18b \ldots 18n$ which distribute electrical power to loads $20a, 20b \ldots 20n$ through corresponding sensors $21a, 21b \ldots 21n$, line interrupters $22a, 22b \ldots 22n$, and blocking filters $23a, 23b \ldots 23n$. The line conductors 16 and a neutral conductors 18 are typically at 240 volts or 120 volts, and a frequency of 60 Hz.

Each of the line interrupters 22 is preferably a circuit breaker which includes an overload trip mechanism having a thermal/magnetic characteristic which trips the breaker contacts to an open circuit condition in response to a given overload condition, to disconnect the corresponding load 20 from the power source, as is known in the art. It is also known to provide the circuit breaker 22 with ground fault interrupter circuitry responding to a line-to-ground fault or a neutral-to-ground fault to energize a trip solenoid which trips the circuit breaker and opens the contacts.

The sensors 21 monitor the rate of change of electrical current in the respective line conductors 16 and produce signals representing the rate of change. The rate-of-change signal from each sensor 21 is supplied to the corresponding arcing detector 10, which produces a pulse each time the rate-of-change signal increases above a selected threshold. The rate-of-change signal and/or the pulses produced therefrom are filtered to eliminate signals or pulses outside a selected frequency range. The final pulses are then monitored to detect when the number of pulses that occur within a selected time interval exceeds a predetermined threshold. In the event that the threshold is exceeded, the detector 10 generates an arcing-fault-detection signal that can be used to trip the corresponding line interrupter 22 .

In one embodiment, the sensor 21 comprises a toroidal sensor having an annular core encompassing the current-carrying load line, with the sensing coil wound helically on the core. The core is made of magnetic material such as a ferrite, iron, or molded permeable powder capable of responding to rapid changes in flux. A preferred sensor uses a ferrite core wound with 200 turns of 24–36 gauge copper wire to form the sensing coil. An air gap may be cut into the core to reduce the permeability to about 30. The core material preferably does not saturate during the relatively high currents produced by parallel arcs, so that arc detection is still possible at those high current levels.

Other means for sensing the rate of change of the current in a line conductor are contemplated by the present invention. By Faraday's Law, any coil produces a voltage proportional to the rate of change in magnetic flux passing through the coil. The current associated with an arcing fault generates a magnetic flux around the conductor, and the coil of the sensor 21 intersects this flux to produce a signal. Other suitable sensors include a toroidal transformer with a core of magnetic material or an air core, an inductor or a transformer with a laminated core of magnetic material, and inductors mounted on printed circuit boards. Various configurations for the sensor core are contemplated by the present invention and include toroids which have air gaps in their bodies.

Preferably, the rate-of-change signal produced by the sensor 21 represents only fluctuations in the rate of change within a selected frequency band. The sensor bandpass characteristic is preferably such that the lower frequency cut-off point rejects the power frequency signals, while the upper frequency cut-off point rejects the high frequency signals generated by noisy loads such as a solder gun, electric saw, electric drill, or like appliances, equipment, or tools. The resulting output of the sensor 21 is thus limited to the selected frequency band associated with arcing faults, thereby eliminating or reducing spurious fluctuations in the rate-of-change signal which could result in nuisance tripping. As an example, the sensor bandpass characteristic may have: (1) a lower frequency cut-off point or lower limit of 60 Hz so as to reject power frequency signals, and (2) an upper frequency cut-off point or upper limit of approximately 1 MHz so as to effectively reject high frequency signals associated with noisy loads. These specific frequency cut-off points for the sensor bandpass characteristic are by way of example only, and other appropriate frequency cut-off limits may be adopted depending upon actual frequency ranges for the power signals as well as the noisy load signals.

The desired bandpass characteristic is realized by appropriately selecting and adjusting the self-resonant frequency of the sensor. The current-type sensor is selected to have a predetermined self-resonant frequency which defines associated upper and lower frequency cut-off or roll-off points for the operational characteristics of the sensor. Preferably, the current-type sensor is designed to exhibit the desired bandpass filtering characteristic as it operates to detect the rate of change of current variations within the load line being monitored. The present invention contemplates other means for bandpass filtering the signal output within the selected frequency band. For example, a bandpass filter or a combination of filters in a circuit can be used to attenuate frequencies above or below the cut-off points for the selected frequency band.

In the embodiment of FIG. 1, with the sensors 21 coupled to the line conductor, the detectors 10 in each branch circuit are responsive to the rate-of-change of electrical current on the line conductor and are operable to detect series arcs, line-to-neutral arcs and line-to-ground arcs. Alternatively, the sensors 21 might be coupled to the neutral conductor, rather than the line conductor, in which case the detectors 10 could detect series arcs and line-to-neutral arcs but not line-to-ground faults, unless a second sensing coil were coupled to the line conductor (or simultaneously to both the line and neutral conductors). Specifically, series arcs, which occur between two ends of a broken conductor, will produce equal and opposite rate-of-change currents on the line and neutral conductors and hence can be sensed by a coil on the line or neutral conductor. Line-to-neutral arcs will similarly produce rate-of-change currents on both the line and neutral conductors which may be sensed by a coil on the line or neutral conductor. Line-to-ground faults, however, will produce a rate-of-change current on the line conductor but not the neutral conductor. Hence, they can be sensed by a coil on the line conductor but not by a coil on the neutral conductor (unless the coil on the neutral conductor is simultaneously coupled to the line conductor).

According to another aspect of the present invention, there is provided a testing system and method for testing the arcing fault detection system. The testing system is adapted for use with an arcing fault detection system of the type shown in FIG. 1, which uses a single sensor coupled to the line conductor.

Figure 2:
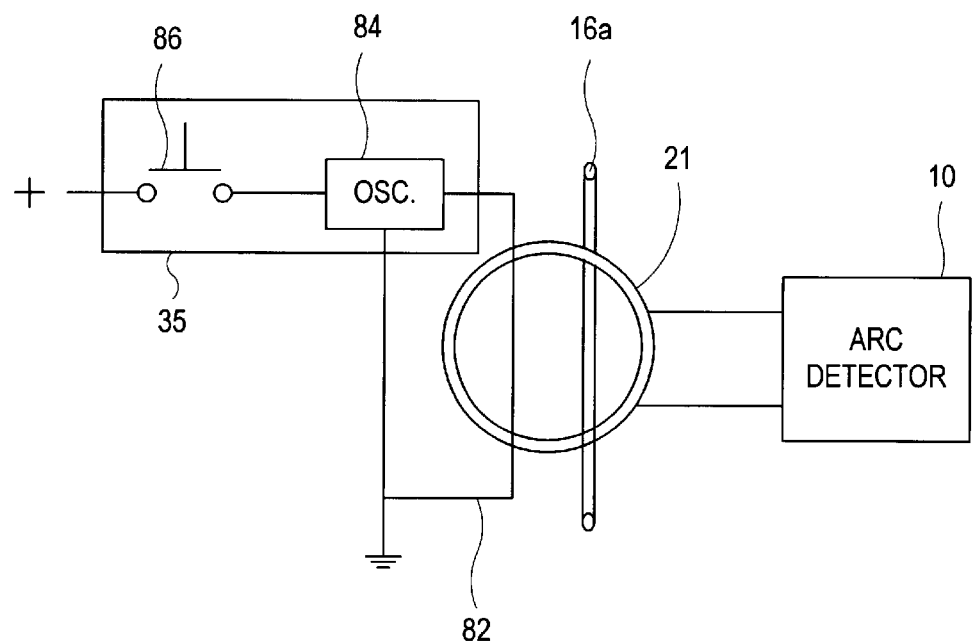
FIG. 2 is a schematic diagram of a test circuit for the arcing fault detection system of FIG. 1.

Turning now to FIG. 2, one embodiment of the testing system will hereinafter be described in detail. Each branch circuit of the electrical distribution system 12 is provided with a test circuit 35 which includes a test wire 82 passing through the sensing coil 21 together with the line conductor 16. The test circuit 35 is adapted to periodically produce a current in the test wire 82 (e.g., a test signal) simulating an arcing fault, preferably an alternating current with a magnitude of less than 100 mA and a frequency of about 10 kHz to 100 kHz.

The test signal, when carried by the test wire 82, is detected by sensor 21, which in turn sends a signal to the arcing fault detector circuit 10. The arcing fault detector circuit 10 processes the signal produced by the sensor 21 and generates an arcing fault detection signal that can be used to trip the line interrupter 22 in the same manner as it would respond to an actual arcing fault signal which, in the embodiment where the sensor 21 is coupled to the line conductor, might comprise series faults, line-to-neutral faults or line-to-ground faults.

Because the current associated with the test signal is relatively small, the test wire can be much smaller than the line conductor. In residential applications, for example, whereas the test wire will carry a current of less than 100, the line conductor will generally carry a current of at least 15–20 A. In such embodiment, the test wire might comprise 24-gauge wire whereas the line conductor might comprise 14- or lower gauge wire.

In the embodiment of FIG. 2, the test signal is produced by an oscillator 84 manually controllable through operation of a push-to-test switch 86. An operator may start the oscillator 84 and introduce the test signal in the test wire 82 by depressing the push-to-test switch 86, and subsequently stop the oscillator by releasing the push-to-test switch 86. Alternatively, a self-test or automatic test can be used instead of the manual test described above. For example, the switch 86 can include a timer for automatically starting and stopping the oscillator 84 at preselected intervals.

Figure 3:
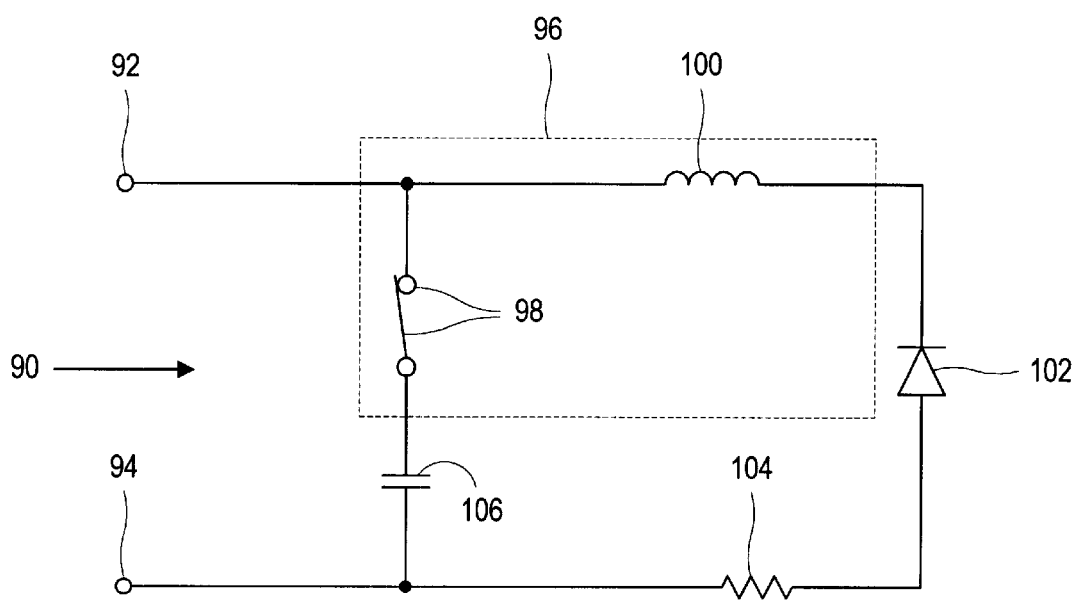
FIG. 3 is a schematic diagram of an alternative test circuit for the arcing fault detection system of FIG. 1.

FIG. 3 shows another embodiment of test circuit 90 which may be used in the arcing fault detection system of FIG. 1. The test circuit 90 may be used in arcing fault detection systems having sensors 21 coupled to the line and/or neutral conductor of an electrical distribution system. A first terminal 92 is adapted for connection to the line conductor 16 and a second terminal 94 is adapted for connection to the neutral conductor of a selected branch circuit of the electrical distribution system. A relay 96 is connected between the first and second terminals 92 and 94. The relay 96 contains a pair of electrical contacts 98 and a relay coil 100. A diode 102 and a resistor 104 are connected between the second terminal 94 and the relay coil 100. A capacitor 106 is connected between the second terminal 94 and the electrical contacts 98. When the first and second terminals 92, 94 are connected to the line and neutral conductors 16, 18 of the selected branch circuit, alternating current from the branch circuit is introduced into the test circuit 90 and energizes the relay 96. The diode 102 thereafter causes the relay coil 100 to drop every half cycle, causing the electrical contacts 98 to rapidly open and close, once every cycle. This chattering effect of the electrical contacts 98 produces a signal on the line conductor 16 which simulates an arcing fault condition. The simulated arcing fault condition is thereafter detected by the sensor 21 (FIG. 1) and processed by the arcing fault detector circuit 10 in the same manner as an actual arcing fault.

The relay 96 preferably comprises a Class 8501 Type KL-12 24 VAC available from Square D Company, but it may comprise any comparable relay known in the art. The capacitor 106 preferably has a value of about 0.47 $\mu F$ and is provided to increase the strength of the simulated arcing fault signal. The resistor 104 is provided to drop the 120 VAC of the branch circuit down to 24 VAC for the relay 96.

In one embodiment, the test circuit 90 is removably attachable to the line and neutral conductors of a selected branch circuit. This enables a user to externally remove and attach the test circuit to a selected branch circuit as often as needed or desired, and at selected positions in the branch circuit, to test the arcing fault detection system. For example, the test circuit 90 might be clamped directly onto the line and neutral bus bars in the panelboard, or might couple to the line and neutral conductors by plugging into an electrical outlet downstream of the panelboard. Alternatively, the test circuit 90 may be housed together with the arcing fault detector circuit in a common module.

Figure 4:
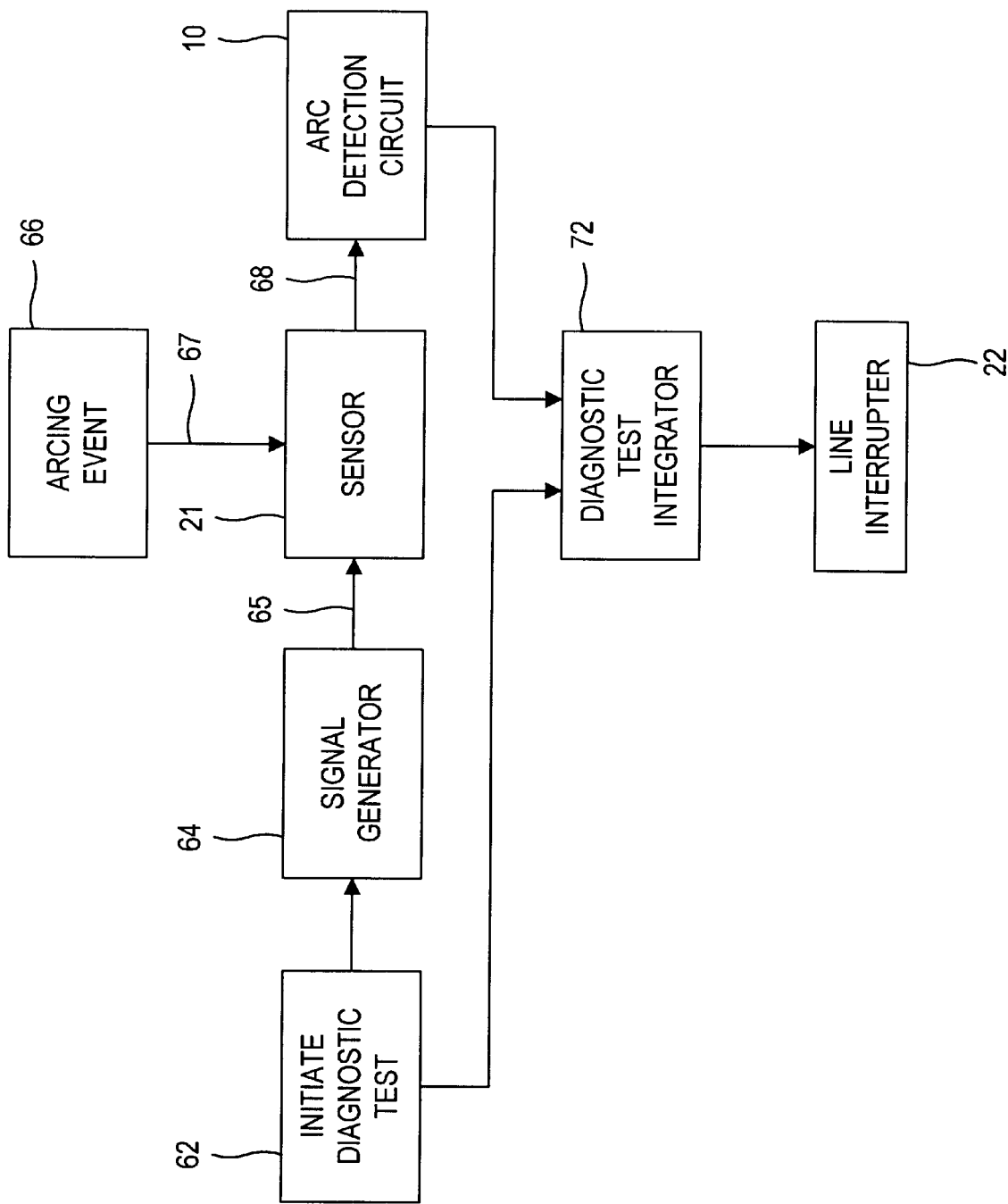
FIG. 4 is a flow chart of an arcing fault detection system and test method according to one embodiment of the present invention.

A flow chart for testing an arcing fault detection system according to principles of the present invention is illustrated in FIG. 4. Block 62 designates the initiation of a diagnostic test within the arcing fault detection system. The initiation step 62 may be accomplished automatically or under operator control. When the diagnostic test is initiated, a signal generator 64 provides a test signal 65 to a sensor 21. The test signal is designed to simulate the occurrence of an arcing fault. The signal generator 64 may comprise the oscillator 84 described in relation to FIG. 2, the test circuit 90 described in relation to FIG. 3 or any other means for producing a test signal 65 simulating an arcing fault. The sensor 21 preferably comprises a toroidal current sensing coil substantially the same as depicted in FIG. 2. The sensor 21 receives the test signal 65 and produces a rate-of-change signal 68. The rate-of-change signal 68 is processed by the arcing fault detection circuit 10 in the manner heretofore described to determine whether or not the test signal 65 represents an arcing fault. In addition, the sensor 21 also monitors the line conductor of a selected branch circuit for the occurrence of "true" arcing faults.

The arc detection circuit 10 thereafter provides an output to a diagnostic test integrator 72 indicating that an arcing fault either was detected or was not detected. The diagnostic test integrator also receives a signal from block 62 indicating whether or not the system is in test. Thus, either of four possible conditions will be received by the diagnostic test integrator 72: (1) the system is in test and an arcing fault was detected; (2) the system is in test and no arcing fault was detected; (3) the system is not in test and an arcing fault was detected; or (4) the system is not in test and no arcing fault was detected. The diagnostic test integrator 72 will produce a trip signal to trip open the contacts of a line interrupter 22 if either condition (2) or (3) occurs. Thus, a trip signal will be produced not only when a true arcing fault is present, but also when an arcing fault should have been indicated during the test protocol as a sign of operability and yet was not so indicated. Conversely, the diagnostic test integrator 72 will not produce a trip signal if either condition (1) or (4) occurs.

Where the sensor 21 comprises a toroidal winding, the arcing fault detection system may be tested by testing the resistance of the winding. This may be accomplished by inputting a test signal having a known voltage through the winding and comparing the resistance of the winding to a known value to determine whether the winding is operating properly. Both of these steps may be accomplished while the sensor 21 is in operation. If the winding is found to be operating outside of an acceptable range above or below the known value, a trip signal is generated to interrupt the current flowing in the branch circuit associated with the sensor 21. If the winding is found to be operating properly, no trip signal is generated. In a preferred embodiment, the presence or absence of a trip signal resulting from testing the resistance of the winding is independent of the presence or absence of a trip signal from the diagnostic test integrator 72 of FIG. 4. For example, if no trip signal is produced because the coil is found to be operating properly as a result of the resistance test, a trip signal may nevertheless still be produced by the diagnostic test integrator 72 of FIG. 4 if either condition (2) or (3) occurs. Conversely, if a trip signal is produced by the resistance test because the coil resistance is not within proper limits, the line interrupter 22 will be triggered to interrupt the current in the branch circuit regardless of whether the diagnostic test integrator 72 of FIG. 4 has produced a trip signal.

Figure 5:
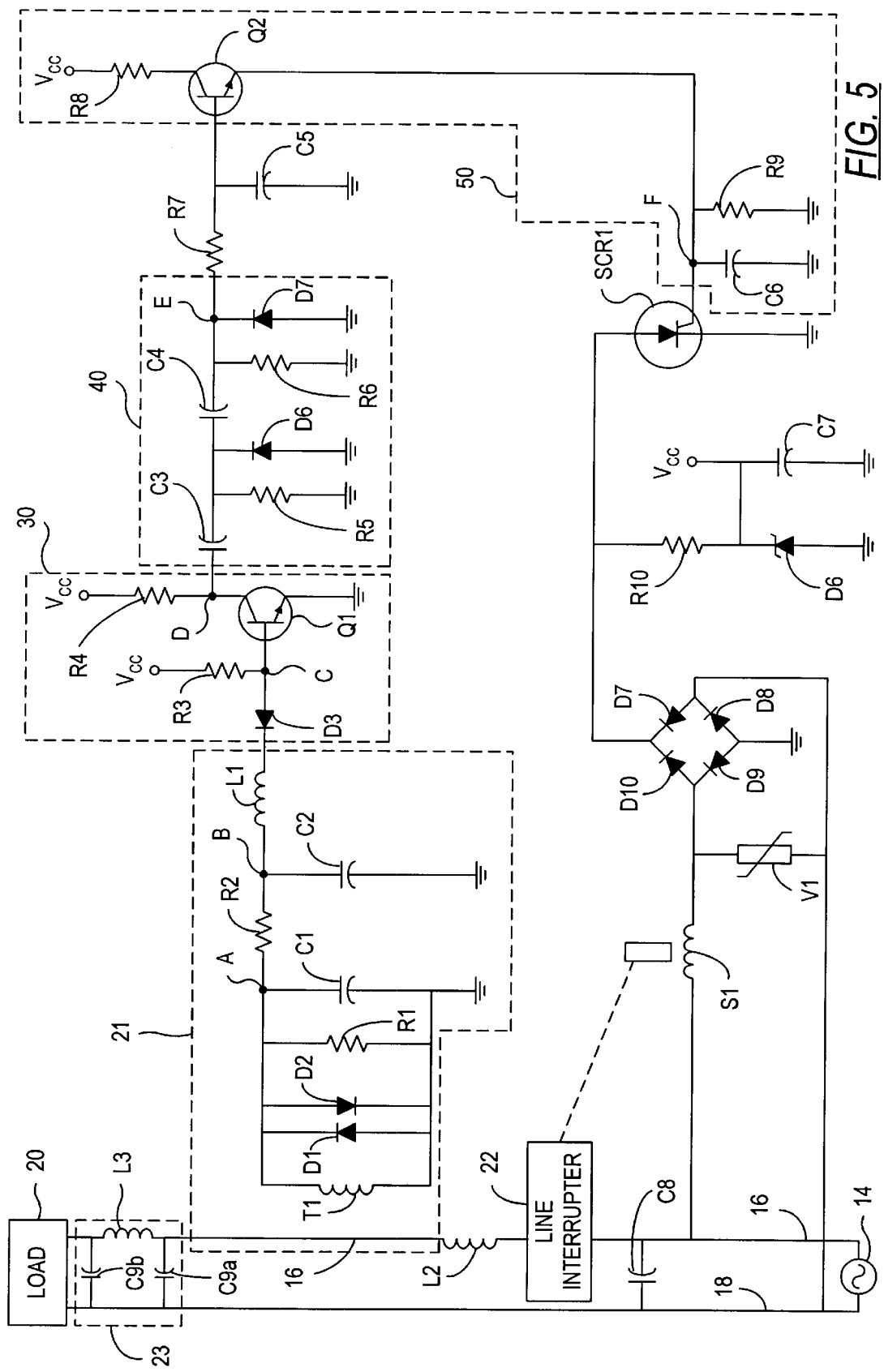
FIG. 5 is a schematic diagram of an electrical circuit for implementing the arcing fault detection system illustrated in FIG. 1.

FIG. 5 illustrates a preferred circuit for the arcing fault detection system of FIG. 1. The sensor 21 comprises a sensor coil T1 which is wound on a core surrounding the line conductor 16. Connected in parallel with the sensor coil T1 are a pair of diodes D1 and D2 which serve as clamping devices during high-power transient conditions. A resistor R1 in parallel with the diodes D1 and D2 dampens self-ringing of the sensor, during high-power transients. A pair of capacitors C1 and C2 in parallel with the resistor R1, and a resistor R2 and an inductor L1 connected in series to the input to a comparator 30, are tuned to assist in attaining the desired rolloff characteristics of the filtering network formed thereby. For example, with the illustrative values listed below for the components of the circuit of FIG. 5, the sensor has a passband extending from about 10 KHz to about 100 KHz, with sharp rolloff at both sides of the passband.

Figure 6A:
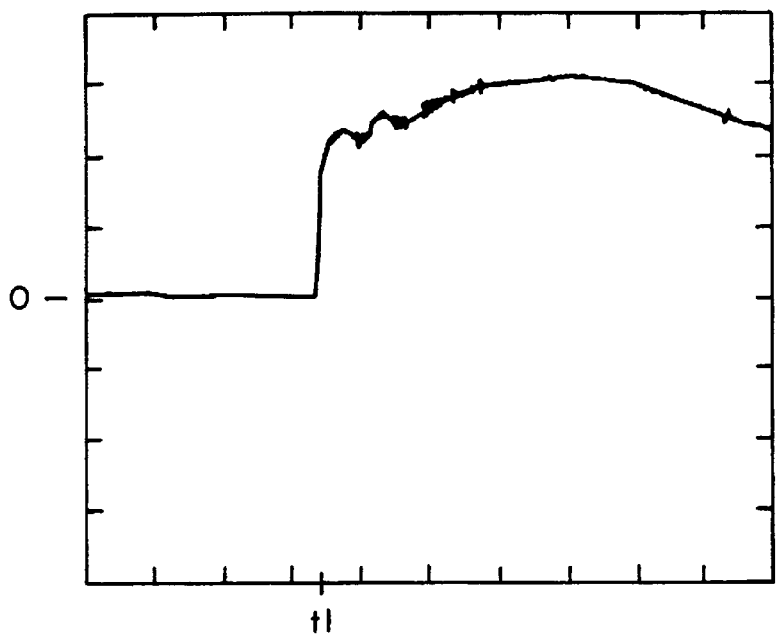
FIGS. 6a through 6g are waveforms at various points in the circuit of FIG. 5.
Figure 6B:
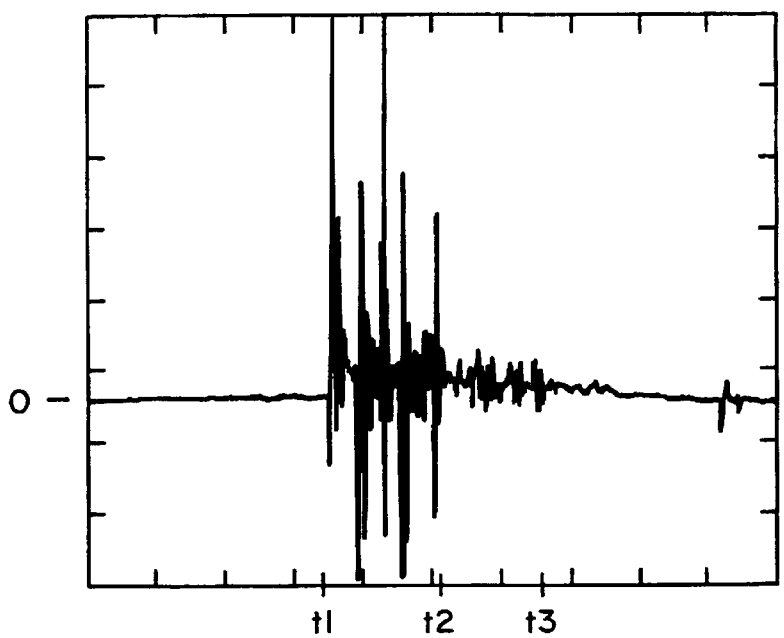

The operation of the circuit of FIG. 5 can be more clearly understood by reference to the series of waveforms in FIGS. 6a through 6g. FIG. 6a is an actual waveform from an oscilloscope connected to a line conductor 16 carrying a-c. power at 60 Hz and experiencing a high-frequency disturbance beginning at time t1. Because the high-frequency disturbance is within the frequency range to which the sensor 21 is sensitive (e.g., from about 10 KHz to about 100 KHz), the disturbance results in a burst of high-frequency noise in the di/dt output signal (FIG. 6b) from the sensor 21 (at point A in the circuit of FIG. 5), beginning at time t1. The noise burst has a relatively high amplitude from time t1 until approximately time t2, and then continues at a low amplitude from time t2 to about time t3 .

The magnitude of the rate-of-change signal from the sensor 21 is compared with the magnitude of a fixed reference signal in a comparator 30, which produces an output voltage only when the magnitude of the rate-of-change signal crosses that of the reference signal. This causes the detector to ignore low-level signals generated by the sensor 21. All signals having a magnitude above the threshold level set by the magnitude of the reference signal are amplified to a preset maximum value to reduce the effect of a large signal. In the comparator 30, a transistor Q1 is normally turned on with its base pulled high by a resistor R3. A diode D3 changes the threshold and allows only the negative pulses from the sensor 21 to be delivered to the base of transistor Q1. When the signal to the comparator drops below the threshold level (minus 0.2 volt for the circuit values listed below), this causes the transistor Q1 to turn off. This causes the collector of the transistor Q1 to rise to a predetermined voltage, determined by the supply voltage $V_{cc}$, a resistor R4 and the input impedence of a single-shot pulse generator circuit 40. This collector voltage is the output of the comparator circuit 30. The collector voltage remains high as long as the transistor Q1 is turned off, which continues until the signal from the sensor 21 rises above the threshold level again. The transistor Q1 then turns on again, causing the collector voltage to drop. The end result is a pulse output from the comparator, with the width of the pulse corresponding to the time interval during which the transistor Q1 is turned off, which in turn corresponds to the time interval during which the negative-going signal from the sensor 21 remains below the threshold level of the comparator.

Figure 6C:
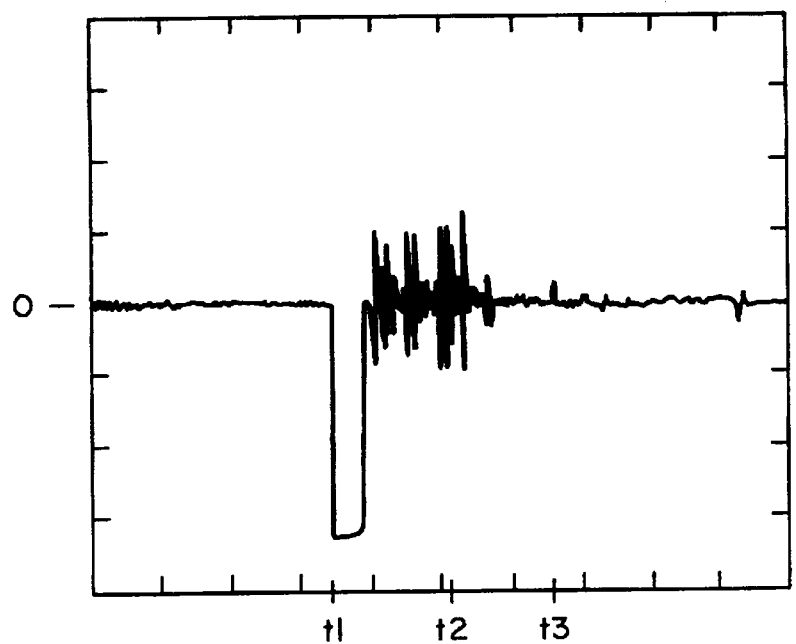
Figure 6D:
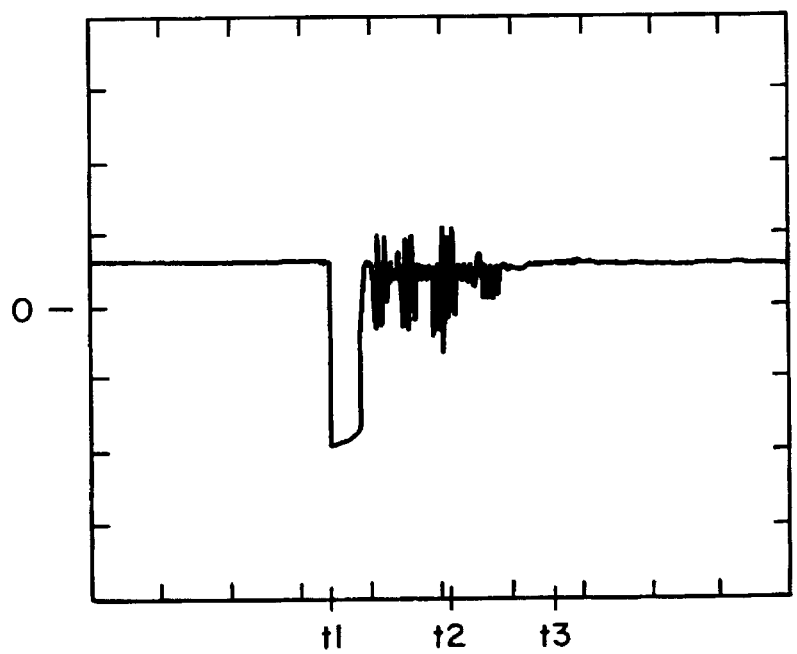

The noise burst in the sensor output is filtered to produce the waveform shown in FIG. 6c at point B in the circuit of FIG. 5. The waveform at point C in the circuit of FIG. 5 is shown in FIG. 6d, and it can be seen that the amplitude has been reduced and a d-c. offset has been introduced by summing the filtered di/dt signal with a d-c. bias from the supply voltage $V_{cc}$ at point C. This is the input signal to the base of the transistor Q1.

Figure 6E:
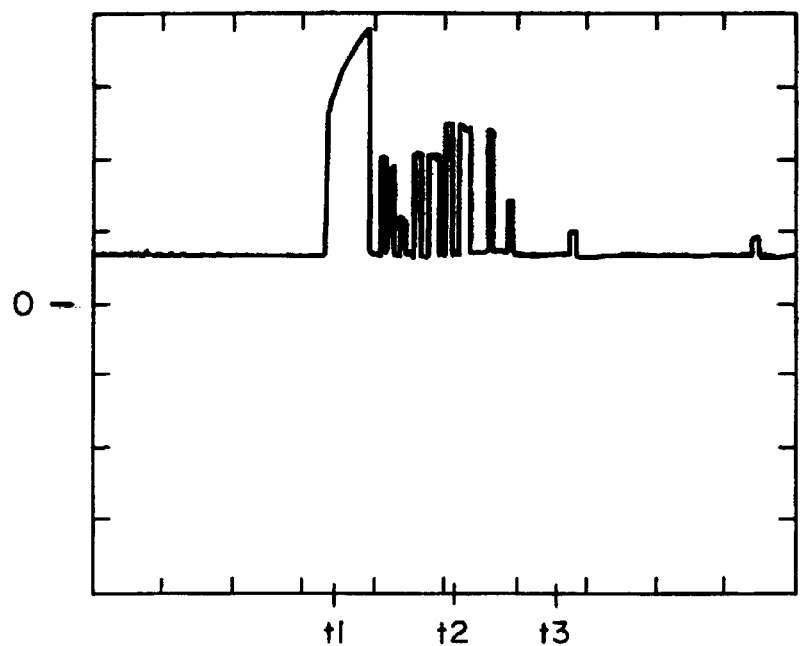

The output of the transistor Q1 is a series of positive-going pulses corresponding to the negative-going peaks in the input signal. The transistor output, at point D in the circuit of FIG. 5, is shown in FIG. 6e. It can be seen that the transistor circuit functions as a comparator by producing output pulses corresponding only to negative-going peaks that exceed a certain threshold in the filtered di/dt signal shown in FIG. 6c. At this point in the circuit, the pulses vary in both width and amplitude, as can be seen in FIG. 6e.

To convert the output pulses of the comparator 30, which vary in both width and amplitude, into a series of pulses of substantially constant width and amplitude, the comparator output is fed to a single-shot pulse generator circuit 40. This high-pass filter circuit includes a pair of capacitors C3 and C4 connected in series to the collector of the transistor Q1, and two resistor-diode pairs connected in parallel from opposite sides of the capacitor C4 to ground. The pulses produced by this circuit will be described in more detail below in connection with the waveforms shown in FIG. 6. The output pulses are predominantly pulses of equal width and amplitude, although occasional larger or smaller pulses can result from especially large or small input pulses.

Figure 6F:
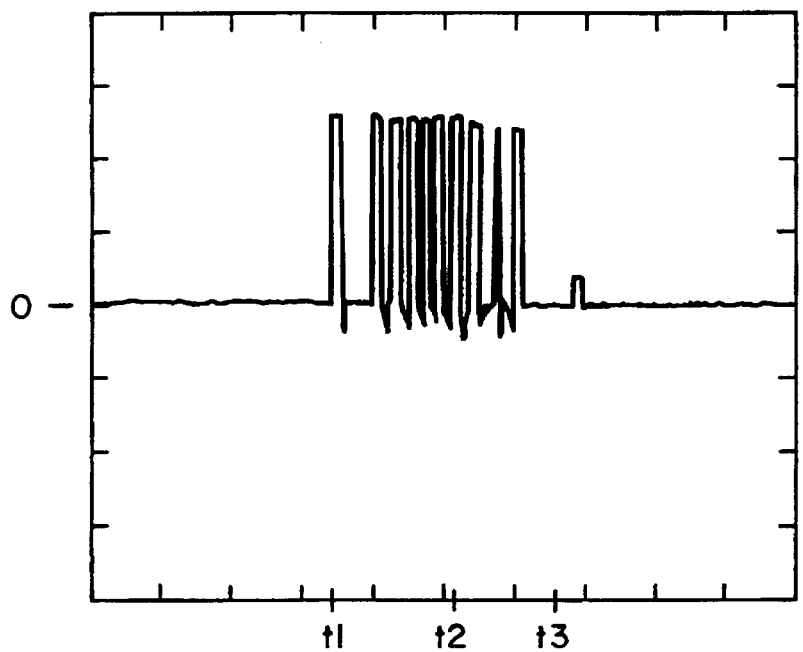

The variable-width and variable-amplitude pulses of FIG. 6e are converted to a series of pulses of substantially constant width and amplitude by the single-shot pulse generator circuit 40. The output of this circuit 40, at point E in the circuit of FIG. 5, is shown in FIG. 6f. Although all the pulses shown in FIG. 6f are of substantially the same size, larger or smaller pulses may be produced by di/dt spikes that are excessively large or excessively small. The vast majority of the pulses at point E, however, are substantially independent of the amplitude and duration of the corresponding spikes in the di/dt signal, provided the spikes are large enough to produce an output pulse from the comparator 30.

The substantially uniform pulses produced by the circuit 40 are supplied to the base of a transistor Q2 through a current-limiting resistor R7. A capacitor C5 connected from the transistor base to ground improves the sharpness of the roll-off of the bandpass filtering. The transistor Q2 is the beginning of an integrator circuit 50 that integrates the pulses produced by the circuit 40. The pulses turn the transistor on and off to charge and discharge a capacitor C6 connected between the transistor emitter and ground. A resistor R9 is connected in parallel with the capacitor C6, and a resistor R8 connected between the supply voltage and the collector of the transistor Q2 determines the level of the charging current for the capacitor C6. The magnitude of the charge on the capacitor C6 at any given instant represents the integral of the pulses received over a selected time interval. Because the pulses are substantially uniform in width and amplitude, the magnitude of the integral at any given instant is primarily a function of the number of pulses received within the selected time interval immediately preceding that instant. Consequently, the value of the integral can be used to determine whether an arcing fault has occurred.

Figure 6G:
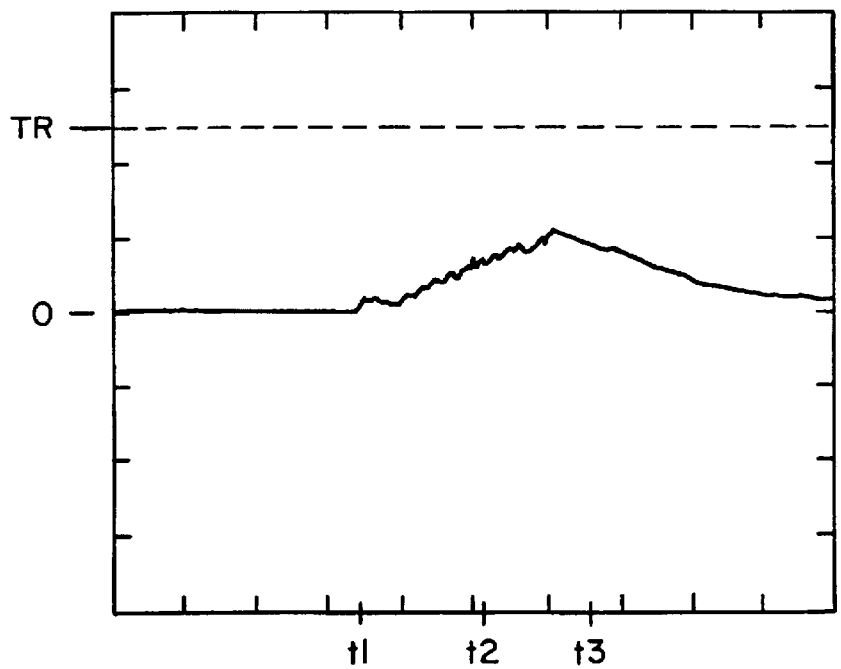

The integral signal produced by the circuit 50 is shown in FIG. 6g, taken at point F in the circuit of FIG. 5. It can be seen that the integrator circuit charges each time it receives a pulse from the circuit 40, and then immediately begins to discharge. The charge accumulates only when the pulses appear at a rate sufficiently high that the charge produced by one pulse is less than the discharge that occurs before the next pulse arrives. If the pulses arrive in sufficient number and at a sufficient rate to increase the integral signal to a trip threshold level TR (FIG. 6g), SCR1 is triggered to trip the circuit breaker. The circuit is designed so that this occurs only response to a di/dt signal representing an arcing fault.

When SCR1 is turned on, a trip solenoid S1 is energized to disconnect the load from the circuit in the usual manner. Specifically, turning on SCR1 causes current to flow from line to neutral through a diode bridge formed by diodes D7–D10, thereby energizing the solenoid to open the circuit breaker contacts in the line 16 and thereby disconnect the protected portion of the system from the power source. The d-c. terminals of the diode bridge are connected across SCR1, and the voltage level is set by a zener diode D6 in series with a current-limiting resistor R10. A varistor V1 is connected across the diode bridge as a transient suppressor. A filtering capacitor C7 is connected across the zener diode D6. The trip circuit loses power when the circuit breaker contacts are opened, but of course the contacts remain open until reset.

One example of a circuit that produces the desired result described above is the circuit of FIG. 5 having the following values:

| | |
|---|---|
| D1 | 1N4148 |
| D2 | 1N4148 |
| D3 | 1N4148 |
| D4 | 1N4148 |
| D5 | 1N4148 |
| D6 | 27v zener |
| R1 | 3.01K |
| R2 | 1.3K |
| R3 | 174K |
| R4 | 27.4K |
| R5 | 10K |
| R6 | 10K |
| R7 | 10K |
| R8 | 4.2K |
| R9 | 4.75K |
| R10 | 24K |
| L1 | 3300uH |
| L2 | 500uH |
| L3 | 500uH |
| C1 | 0.012uF |
| C2 | 0.001uF |
| C3 | 0.001uF |
| C4 | 0.001uF |
| C5 | 0.001uF |
| C6 | 6.8uF |
| C7 | 1.0uF |
| C8 | 1.0uF |
| Q1 | 2N2222A |
| Q2 | 2N2222A |
| SCR1 | CR08AS-12 made by POWEREX-Equal |
| $V_{cc}$ | 27v |

Although a circuit breaker is the most commonly used line interrupter, the output device may be a comparator, SCR, relay, solenoid, circuit monitor, computer interface, lamp, audible alarm, etc.

It will be understood that a number of modifications may be made in the circuit of FIG. 5. For example, the discrete bandpass filter between the sensor and the comparator can be replaced with an active filter using an operational amplifier. As another example, a single-shot timer can be used in place of the single-shot pulse generator in the circuit of FIG. 5. This circuit can receive the output signal from an active filter as the trigger input to an integrated-circuit timer, with the output of the timer supplied through a resistor to the same integrator circuit formed by the resistor R9 and capacitor C6 in the circuit of FIG. 5.

Figure 7:
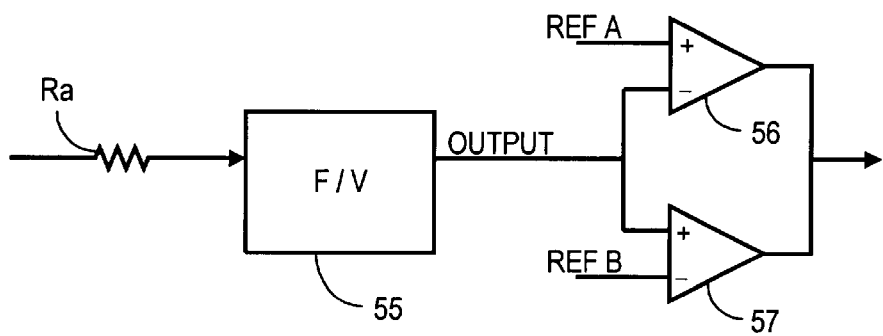
FIG. 7 is a schematic diagram of an alternative circuit for use in place of the comparator and single-shot pulse generator in the circuit of FIG. 5.

FIG. 7 illustrates a frequency-to-voltage converter circuit that can be used in place of all the circuitry between point A and the integrator circuit in FIG. 5. In this circuit, the signal from point A in FIG. 5 is supplied through a resistor Ra to a frequency/voltage converter integrated circuit 55 such as an AD537 made by Analog Devices Inc. The output of the integrated circuit 55 is fed to a pair of comparators 56 and 57 that form a conventional window comparator. Specifically, the output of the circuit 55 is applied to the inverting input of a comparator 56 and to the non-inverting input of a comparator 57. The other inputs of the comparators 56 and 57 receive two different reference signals A and B which set the limits of the window, i.e., the only signals that pass through the window comparator are those that are less than reference A and greater than reference B.

Figure 8:
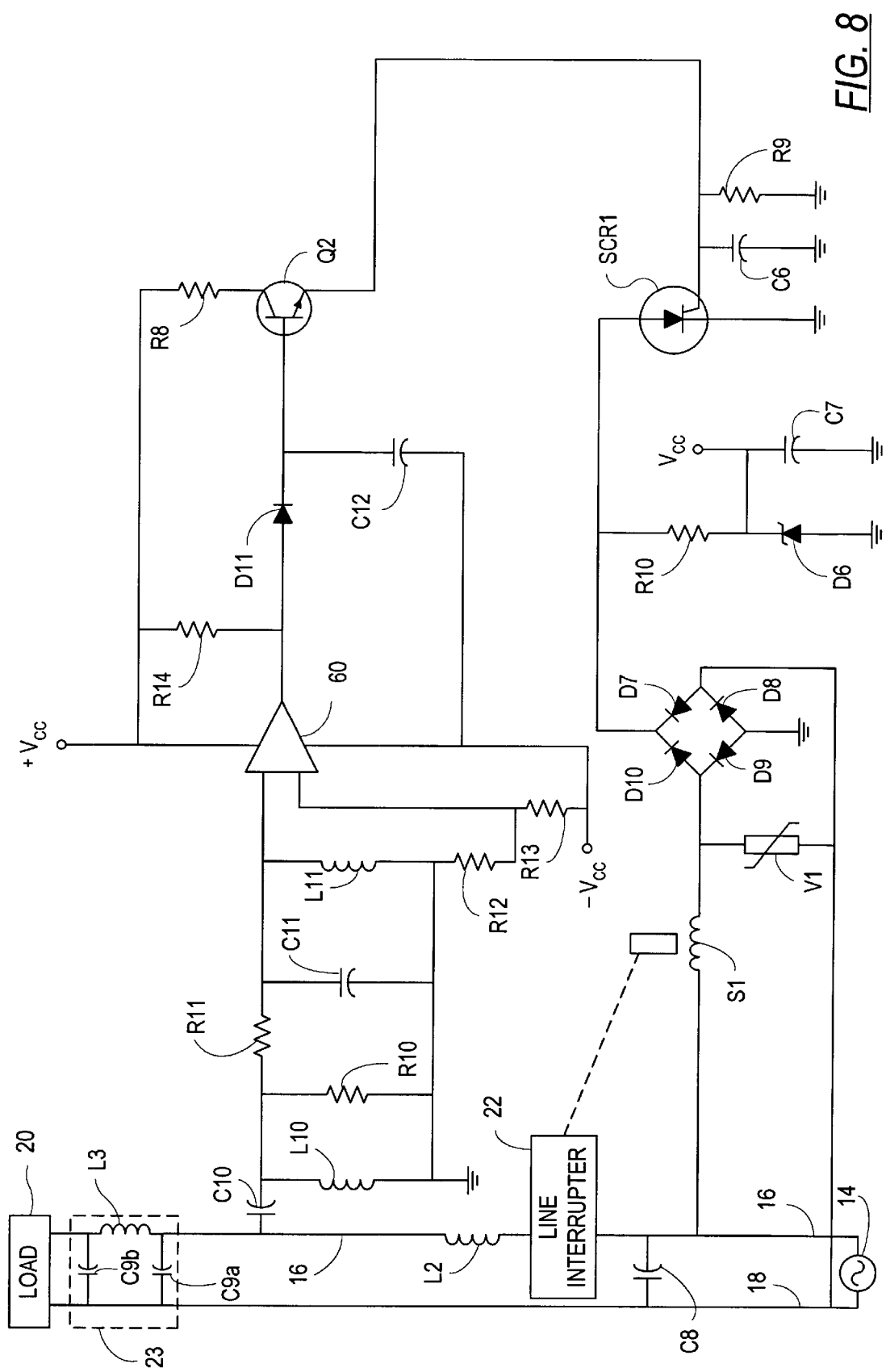
FIG. 8 is a schematic diagram of an alternative circuit for implementing the arcing fault detection system illustrated in FIG. 1.

FIG. 8 illustrates an arc detector 10 for sensing the rate of change of the line voltage, i.e., dv/dt, rather than current. The sensor in this circuit is a capacitor C10 connected between a line conductor 16 and an inductor L10 leading to ground. The inductor L10 forms part of a bandpass filter that passes only those signals falling within the desired frequency band, e.g., between 10 KHz and 100 KHz. The filter network also includes a resistor R10, a capacitor C11 and a second inductor L11 in parallel with the first inductor L10, and a resistor R11 connected between the resistor R10 and the capacitor C11. The resistor R10 dampens the ringing between the capacitor C10 and the inductor L10, and the resistor R11 adjusts the threshold or sensitivity of the circuit. The inductors L10 and L11 provide low-frequency roll-off at the upper end of the pass band, and a capacitor C11 provides the high-frequency roll-off at the lower end of the pass band.

The capacitor C10 may be constructed by attaching a dielectric to the line bus so that the bus forms one plate of the capacitor. The second plate of the capacitor is attached on the opposite side of the dielectric from the bus. The sensor circuit is connected to the second plate.

The output of the bandpass filter described above is supplied to a comparator 60 to eliminate signals below a selected threshold, and to limit large signals to a preselected maximum amplitude. The filter output is applied to the inverting input of the comparator 60, through the resistor R11, while the non-inverting input receives a reference signal set by a voltage divider formed by a pair of resistors R12 and R13 connected between $V_{cc}$ and ground. The comparator 60 eliminates very low levels of signal received from the sensor. The comparator 60 is normally off when there is no arcing on the line conductor 16, and thus the comparator output is low. When the voltage signal from the sensor is more negative than the reference input (e.g., −0.2 volts), the output from the comparator goes high, and a forward bias is applied to the transistor Q2 that drives the integrator circuit. A capacitor C12 connected from the base of transistor Q2 to -$V_{cc}$ filters out high frequency noise. A diode D11 is connected between the comparator output and the base of the transistor Q2 to block negative signals that would discharge the capacitor C12 prematurely. The rest of the circuit of FIG. 8 is identical to that of FIG. 5.

When a fault occurs, it is desirable to isolate the branch of the distribution system in which the arcing fault occurred from the rest of the distribution system. In the system of FIG. 1, such isolation is provided by isolator #1 (24a, 24b . . . 24n) and/or isolator #2 is (25a, 25b . . . 25n). Isolator #1 is designed for use in a system using a current-type sensor, as shown in FIG. 5, while isolator #2 is designed for use in a system using a voltage-type sensor, as shown in FIG. 8. Both isolator #1 and #2 may be used in a system having both a current- and a voltage-type sensor.

As shown in FIG. 5, isolator #1 comprises a capacitor C8 connected between the load line 16 and the neutral line 18 in each branch of the distribution system. The capacitor C8 is located between the line interrupter 22 and the power source 14 to provide a low impedance path for an arcing fault from the line conductor 16 to the neutral conductor 18, independent of the impedance of the load 20. More specifically, the capacitor C8 is designed to effectively short high-frequency arcing fault signals from line conductors 16 to neutral conductors 18, thus preventing a series path from being created between branch circuits and preventing the erroneous detection of arcing faults in other branch circuits. For example, with reference to FIG. 1, the isolator #1 will prevent high frequency arcing fault signals on line conductor 16a from crossing over to line conductor 16b. Accordingly, an arcing fault signal on line conductor 16a will properly trigger line interrupter 22a but will not trigger line interrupter 22b.

As shown in FIG. 8, isolator #2 comprises an inductor L2 in the load line 16 for each branch circuit. Each inductor L2 is located between the line interrupter 22 and the sensor 21 to provide an impedance for the current produced by an arcing fault.

The arcing fault detection system also includes a blocking filter 23 in each branch circuit for blocking false arcing fault signals or other nuisance output signals generated by normal operation of the load 20. Each blocking filter 23 is connected between the sensor 21 and the load 20 in each branch circuit to prevent false arcing fault signals from being delivered to the sensor 21. As seen in FIGS. 5 and 8, the preferred blocking filter includes a pair of capacitors C9a and C9b connected between the load line 16 and the neutral line 18 of each branch circuit. An inductor L3 is connected in the load line 16 between the two capacitors C9a and C9b. Preferably, the capacitors C9a and C9b have a rating across the line of about 0.47 uF. The inductor L3 has a rating for 15 amps at 500 uH and dimensions of about 1.5" diameter and 1.313" in length (e.g., Dale IHV 15–500). These values, of course, can be adjusted for the power rating of the electrical system and the loads 20.

The capacitor C9a creates a low impedance path for any series arcing that occurs upstream of that capacitor, such as arcing within the wall upstream of a noisy load. This permits series arcing to be detected in the branch containing the blocking filter. The inductor L3 creates an impedance that does most of the attenuation of the signal created by a noisy load. This inductor is sized to carry the load current of the device, which is typically 15 or 20 amperes. The second capacitor C9b reduces the amount of inductance required in the inductor L3, by creating a low impedance path across the load 20.

One of the advantages of the blocking filter 23 is that it can be used locally on a particular branch circuit that is known to connect to a load 20 which is noisy. The expense of using the blocking filter 23 is reduced since it can be used only where needed. The blocking filter 23 also allows easy retrofitting to existing electrical distribution systems in residences and commercial space.

Although the above system has been described in connection with an ordinary 120 volt system, it is applicable to the voltages of any standard, including 12, 120, 240, 480, 600 and 18500 volts. The system is suitable for use in residential, commercial and industrial applications, single-shot or multiphase systems and at all frequencies for a-c. as well as d-c. This system is applicable to automotive, aviation, and marine needs, separately derived sources such as generators or UPS, and capacitor banks needing incipient fault protection.

Figure 9:
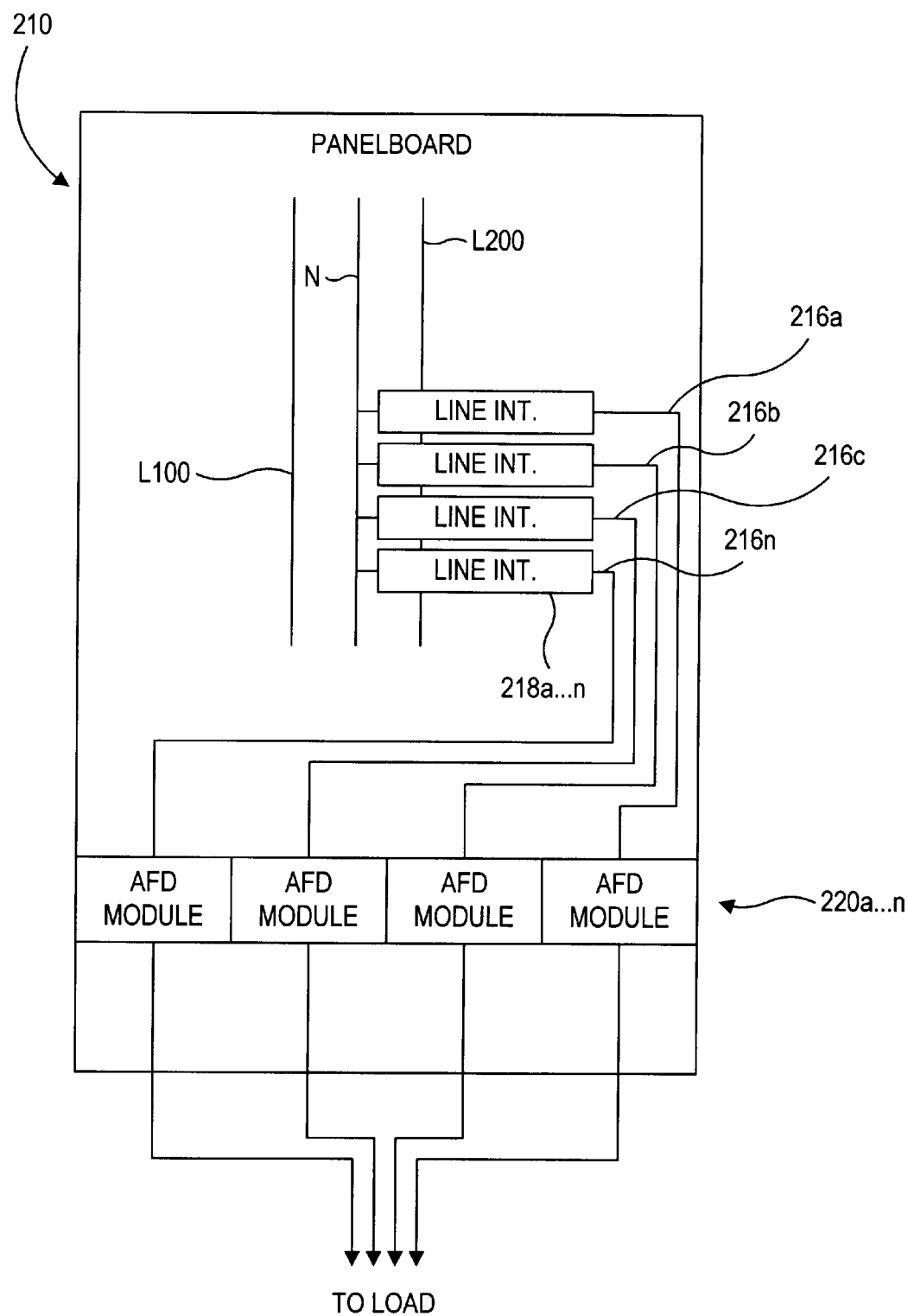
FIG. 9 is a block diagram of a panelboard including an integrated protection system according to one embodiment of the present invention.

FIG. 9 depicts a panelboard 210 including an integrated protection system according to one embodiment of the present invention. As used herein, the term "panelboard" is intended to encompass electrical distribution devices having current capacities suitable for either residential, commercial or industrial uses. The panelboard 210 receives electrical power from a utility source through line buses L100 and L200 and a neutral bus N and distributes the power to loads in a plurality of branch circuits defined by line conductors 216a, 216b, 216c . . . 216n and neutral conductors (not shown). The line conductors 216a, 216b, 216c . . . 216n are electrically connected to one of the line buses L100, L200 and the neutral conductors are electrically connected to the neutral bus N. The panelboard 210 comprises a framework for attaching various circuit protection devices to the line and neutral conductors in either of the branch circuits.

In the embodiment shown in FIG. 9, the integrated protection system includes a plurality of line interrupters 218a, 218b, 218c . . . 218n and arcing fault detector modules 220a, 220b, 220c . . . 220n (hereinafter "AFD modules"). Each of the line interrupters 218a, 218b, 218c . . . 218n is designed to protect the branch circuit to which they are connected from overcurrents by disconnecting the load from the power source in response to the occurrence of an overload or short circuit in the branch circuit. The line interrupters may be plugged onto or bolted to one of the line buses L100 or L200 as shown in FIG. 9, or they may be mounted separately within the panelboard 210 and connected to one of the line buses L100 or L200 by wire. The line interrupters may comprise standard circuit breakers, fuses, relays, automatic switches or any suitable means known in the art for interrupting electrical current in response to a trip signal.

Figure 16:
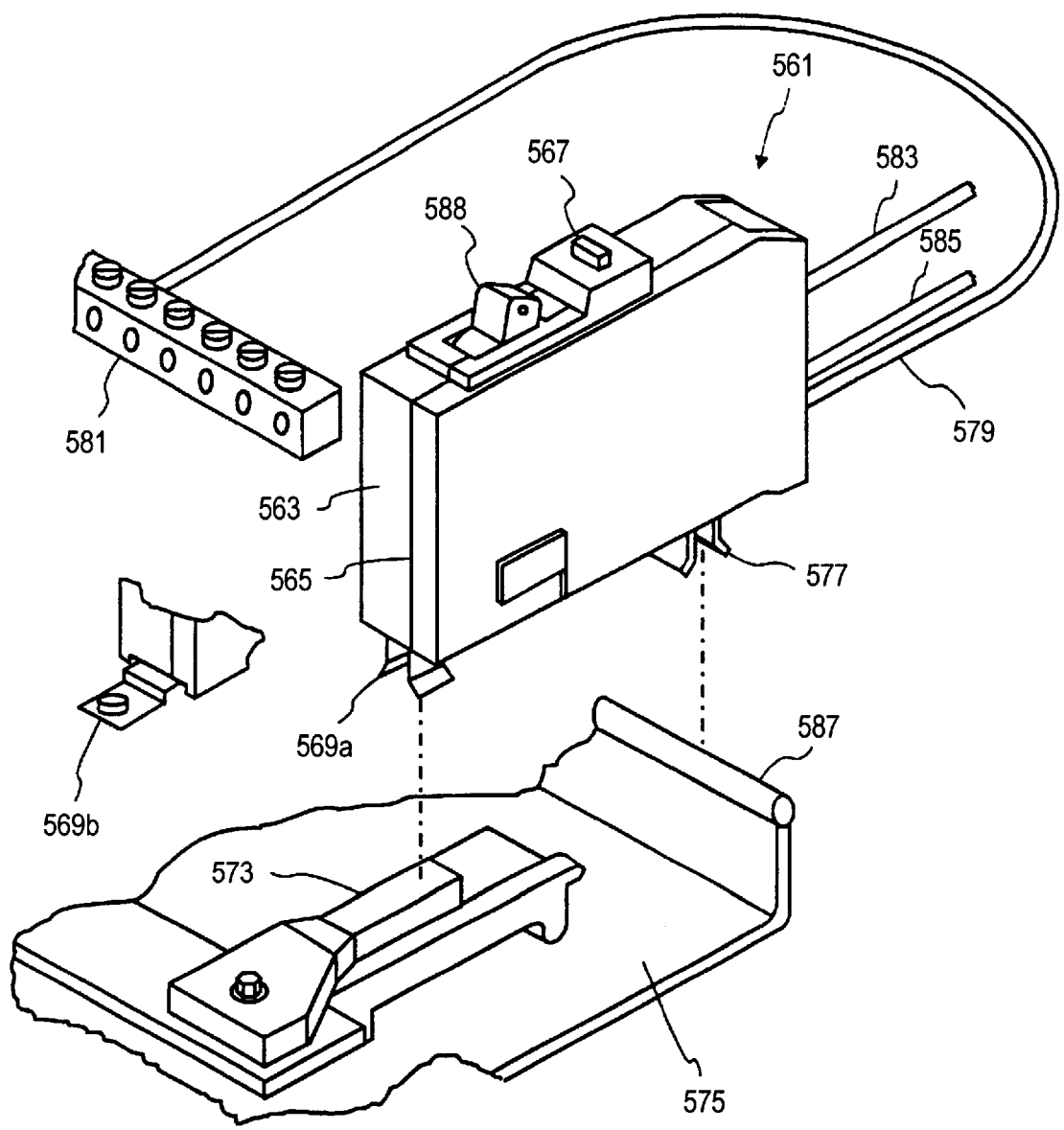
FIG. 16 is a perspective view of a miniature circuit breaker housing adapted for mounting to a panelboard and which may include the combination module of FIG. 15.

In one embodiment of the present invention, the line interrupters comprise circuit breakers which are connected to the panelboard by means of a miniature circuit breaker housing 561 as depicted in FIG. 16. The miniature circuit breaker housing 561 is comprised of an electrically-insulating base 563 closed at one face by a detachable cover 565 which together enclose the components of a miniature circuit breaker which, for example, may comprise a standard circuit breaker, or a circuit breaker with ground fault detection capability. A clip 577 is provided for mounting the housing 561 to a mounting bracket 587 of a panelboard 575 of an electrical distribution system. An electrically-conductive jaw-like terminal 569a or bolt terminal 569b extends through the base 563 to be externally connected to a line bus bar 573 within the panelboard 575. Similarly, a panel neutral conductor 579 extends through the housing 561 for connection to a neutral bar 581 in the panelboard 575. External connections to the line and neutral conductors leading to a load center of a branch circuit of the electrical distribution system are provided through a load line conductor 583 and load neutral conductor 585, respectively. An operating handle 588 and test button 567 are mounted through separate openings in the base 563 for external manual operation of the miniature circuit breaker.

In one embodiment, the AFD modules 220 include a sensor responsive to the rate-of-change of electrical current on the line conductor and are operable to detect series arcs, line-to-neutral arcs and line-to-ground arcs in generally the same manner described in relation to FIG. 1. It will be appreciated, however, that alternative types of arcing fault detection systems may be enclosed within the AFD modules 220, including those which have sensors coupled to the neutral conductor, rather than the line conductor. In the latter case, the AFD modules 220 could detect series arcs and line-to-neutral arcs but not line-to-ground faults.

Figure 10:
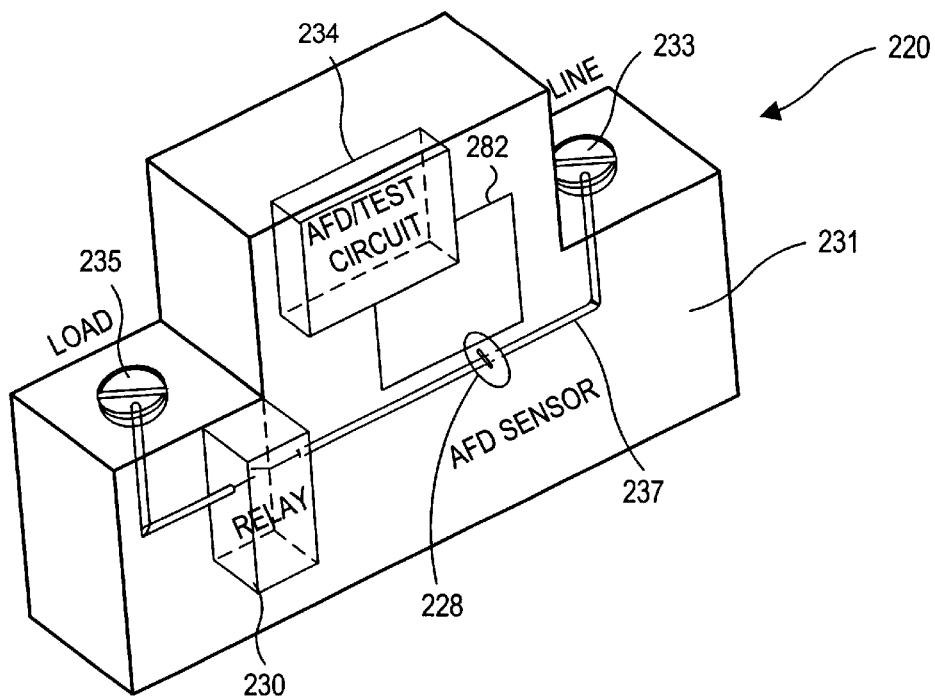
FIG. 10 is a perspective view of an arcing fault detector module which may be used in the system of FIG. 9.
Figure 11:
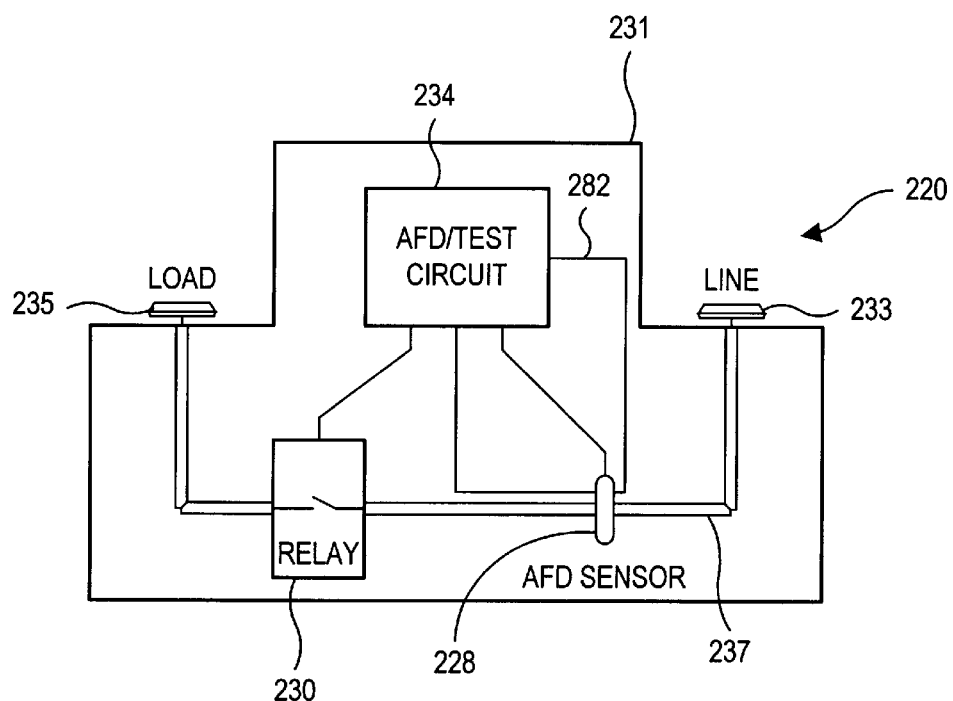
FIG. 11 is a block diagram of the arcing fault detector module of FIG. 10.

One embodiment of the AFD module 220 is shown in FIGS. 10 and 11. The AFD module 220 comprises a housing 231 which is adapted to be connected to one of the positions in the panelboard. A line terminal 233 is provided for connecting the AFD module 220 to one of the line conductors 216a . . . 216n by wire. Line current enters the AFD module 220 through the line terminal 233, flows through the AFD module 220 via internal line conductor 237 and exits the AFD module 220 via load terminal 235 before being supplied to the load. An AFD sensor 228 surrounds the internal line conductor 237 and senses the rate of change of electrical current flowing through the internal line conductor 237. The rate-of-change signal from the sensor 228 is supplied to the AFD/TEST circuit 234, which produces a pulse each time the rate-of-change signal increases above a selected threshold. The rate-of-change signal and/or the pulses produced therefrom are filtered to eliminate signals or pulses outside a selected frequency range. The final pulses are then monitored to detect when the number of pulses that occur within a selected time interval exceeds a predetermined threshold. In the event that the threshold is exceeded, the detector 234 generates an arcing-fault-detection signal that can be used to trip the line interrupter 230. The line interrupter 230 in the AFD module 220 is designed to interrupt power in the branch circuit resulting from an arcing fault, not an overcurrent (overload or short circuit) condition. Accordingly, as shown in FIGS. 10 and 11, it is preferred that the line interrupter 230 in the AFD module 220 comprise a relay rather than a circuit breaker such as that described in relation to FIGS. 13 and 14.

The AFD/TEST circuit 234 is adapted to periodically produce a current in a test wire 282 (e.g., a test signal) simulating an arcing fault, preferably an alternating current with a frequency of about 10 kHz to 100 kHz. The test wire 282 passes through the AFD sensor 228 together with the internal line conductor 237. The test signal, when carried by the test wire 282, is detected by sensor 228, which in turn sends a signal to the AFD/TEST circuit 234 which processes the signal and generates an arcing fault detection signal that can be used to trip the line interrupter 230 in the same manner as it would respond to an actual arcing fault signal. The test wire 282, being coupled to the sensor 228 which is coupled to the internal line conductor 237, produces a test signal which simulates series faults, line-to-neutral or line-to-ground faults. Alternatively, if the test wire 282 were coupled to a sensor 228 which is coupled to the neutral conductor, rather than the line conductor, the test signal could simulate series faults and/or line-to-neutral faults but not line-to-ground faults.

Figure 12:
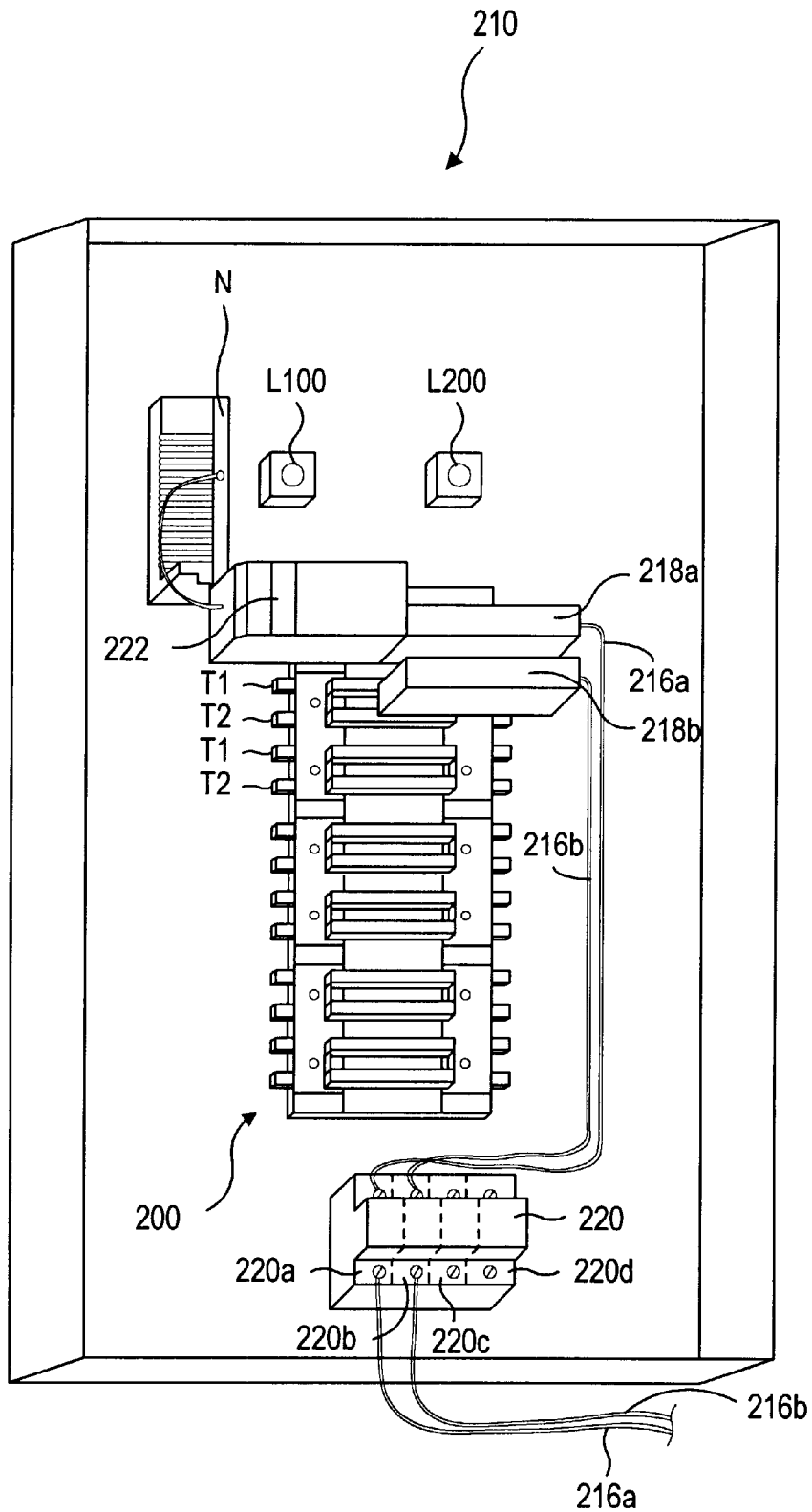
FIG. 12 is a perspective view of a panelboard including the integrated protection system of FIG. 9 with an isolation module at the distribution panel.

Turning now to FIG. 12, the integrated protection system of FIG. 9 is shown in another embodiment using an isolation module 222 at the distribution panel. The isolation module 222 is designed to ensure that arcing fault signals are "isolated" to the branch circuit in which they occur. For example, the isolation device 222 shown in FIG. 12 ensures that arcing fault signals present on line conductor 216a do not cross over to line conductor 216b, and vice versa. A series of bus bar tabs T1 and T2 extend in alternating fashion along the length of distribution center 200. Each of the tabs T1 are electrically connected to line bus L100 and each of the tabs T2 are electrically connected to line bus L200. (The electrical connection between tabs T1, T2 and line buses L100, L200 is not visible in FIG. 12.) The isolation module 222 is electrically connected to the neutral bus N through pig-tail wire 219. The isolation module 222 comprises a "two-pole" module, connected to one of the tab pairs T1, T2 (not visible in FIG. 12), thus electrically connected to both line buses L100 and L200. It will be appreciated, however, that isolation may be provided by one or two "single-pole" isolation modules (not shown), each connected to one of the line buses L100 or L200 and the neutral bus N. In either case, it will further be appreciated that the isolation module (s) 222 may be connected to the line buses L100 and/or L200 by wire or other suitable means known in the art rather than as described above.

The electrical distribution system may also include individual isolation modules (not shown) for one or more of the individual branch circuits instead of the dual-pole isolation module 222 shown in FIG. 12. However, if individual isolation modules are desired, they must be positioned on the power source side of an arcing fault detector in any given branch circuit. For example, if branch isolation modules are used in FIG. 12, they must be positioned on the power source side of arcing fault detector modules 220a, 220b, 220c or 220d.

Figure 13:
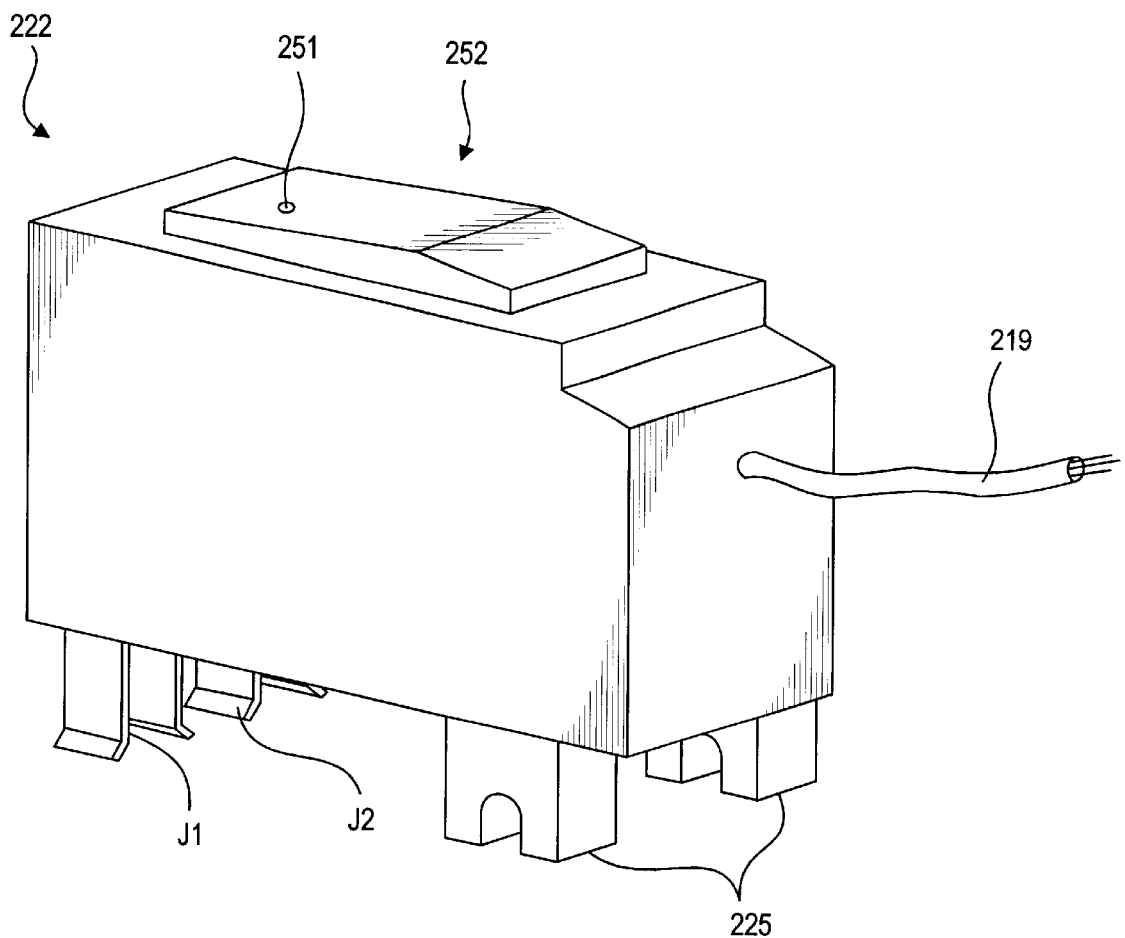
FIG. 13 is a perspective view of an isolation module which may be used in the system of FIG. 2.

The exterior housing of the two-pole isolation module 222 is illustrated in more detail in FIG. 13. Jaws J1 and J2 on one side of the isolation module 222 are each adapted to plug onto one of the bus bar tabs T1, T2 of the distribution panel and thus provide an electrical connection to respective line buses L100 and L200. For instance, jaw J1 may be electrically connected to line bus L100 through connection to bus bar tab T1 and jaw J2 may be electrically connected to line bus L200 through connection to bus bar tab T2. Rail clips 225 on another side of the isolation module 222 are adapted to plug onto a mounting rail in the panelboard to help retain the isolation module 222 firmly in position in the panelboard. Pig-tail wire 219 connects the device to the neutral bus N. A window 251 in a top wall 252 of the housing allows a user to see an LED inside the device.

Figure 14:
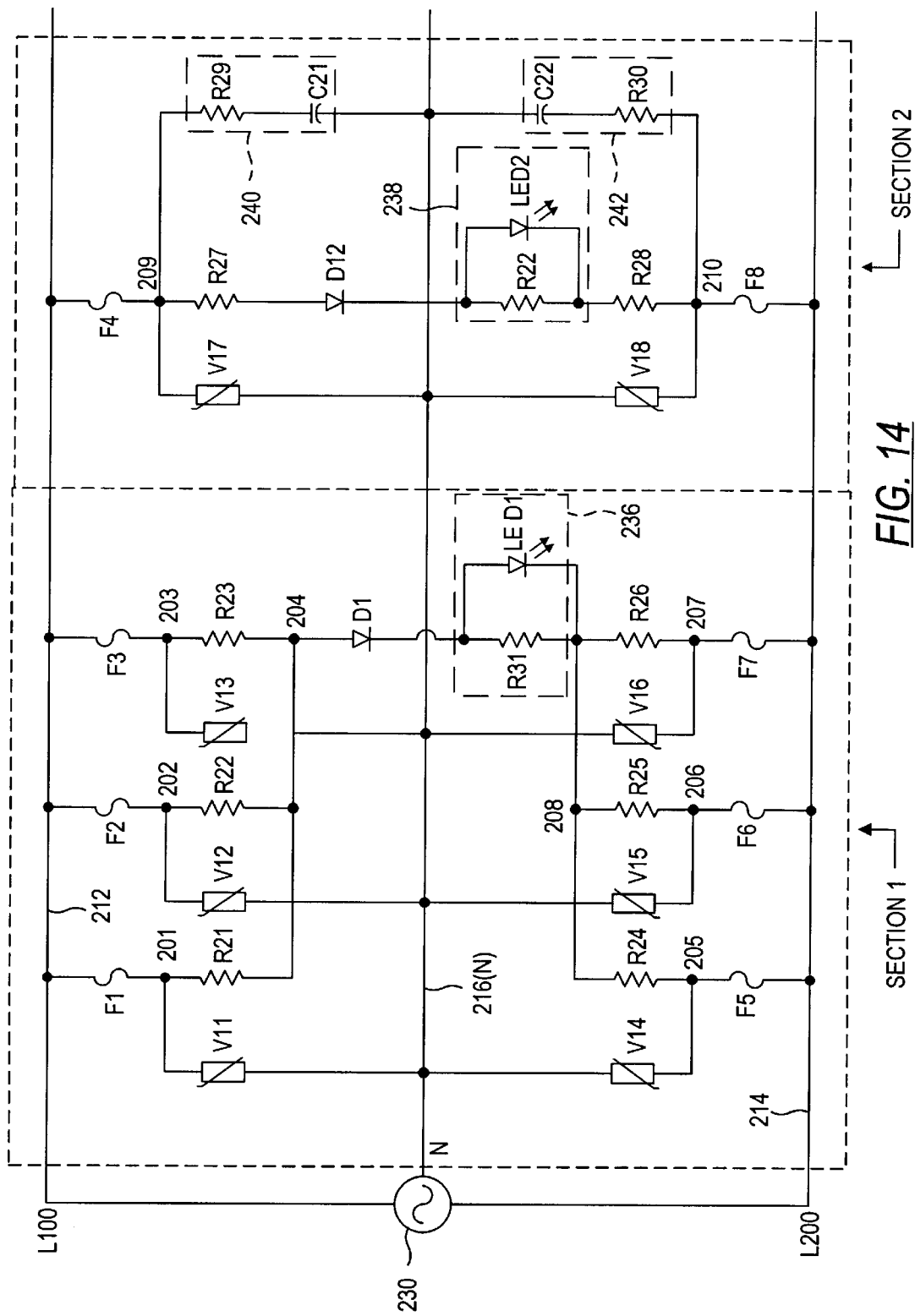
FIG. 14 is a schematic diagram of an electrical circuit for implementing the isolation module of FIG. 13.

FIG. 14 depicts an electrical circuit for implementing the two-pole isolation module 222 described in relation to FIGS. 12 and 13. As shown in FIG. 14, the two-pole isolation module 222 is connected to supply source 230 via line buses L100 and L200 and neutral bus N. The isolation module 222 includes both surge protection circuitry (section 1) and isolation circuitry (section 2). However, it will be appreciated that module 222 may contain only isolation circuitry.

Referring initially to the surge protection circuitry (section 1) and, more specifically, to the portion of section 1 located between the line bus L100 and neutral bus N, there is provided a plurality of fuses F1, F2, F3 connected between the line bus L100 and nodes 201, 202, and 203 respectively. Varistors V11, V12, and V13 are connected between nodes 201, 202, and 203, respectively, and the neutral bus N. Preferably, the varistors are metal oxide varistors using zinc oxide. Resistors R21, R22, R23 are connected between nodes 201, 202, and 203, respectively, and node 204.

Fuses F1, F2, and F3 open if the respective varistors V11, V12, and V13 fail, that is if a destructive surge occurs. Resistors R21, R22, and R23 form a resistance ladder which develops a voltage across display resistor R31. Diode D11 provides a forward bias between node 204 and the first display 236.

Now referring to the remainder of the surge protection circuitry (section 1) located between the line bus L200 and the neutral bus N, there is provided a plurality of fuses F4, F5 and F6 connected between the line bus L200 and nodes 205, 206 and 207 respectively. Varistors V14, V15 and V16 are connected between nodes 205,206 and 207, respectively, and the neutral bus N. Resistors R4, R5 and R6 are connected between node 205,206 and 207 respectively and node 208. The fuses F4, F5 and F6 are designed to open if the respective varistors V14, V15 and V16 fail.

Display 236 comprises a resistor R31 connected in parallel with a light emitting diode LED1 visible through an opening 251 in a top wall 252 of isolation module 222 (shown in FIG. 14). LED1 provides for monitoring the status condition of varistor and fuse pairs such as V11 and F1. The intensity of LED1 decreases when a fuse is blown. When only a predetermined number of varistor and fuse pairs remain operational, LED1 will extinguish entirely to signal for replacement of the surge protection circuitry.

Specifically, the light output of LED1 varies with the operating condition of each varistor and fuse pair. Display 236 uses the first plurality of resistors R21, R22 and R23, the second plurality of resistors R4, R5 and R6, diode D11, resistor R31 and LED1 to indicate when the circuit is operating correctly. The resistance ladder of the first set of resistors R2–R23 monitors the fuses F1, F2 and F3 on line bus L100 and the second set of resistors R24–R26 monitors the fuses F4, F5 and F6 and the line bus L200. Line buses L100 and L200 each develop a voltage across resistor R3 that is proportional to the number of conducting fuses F1, F2, F3, F4, F5, F6. Only when a preselected number of these fuses are intact will sufficient voltage be available to forward bias LED1 to emit a signal to indicate that the surge protection circuitry is operational.

The above-described surge arrestor circuit is designed to limit the voltage between line bus L100 and neutral bus N upon the occurrence of a voltage surge. The operation of the surge arrestor circuit is described in detail in U.S. Pat. No. 5,412,526, hereby incorporated by reference.

Referring next to the isolation circuitry (section 2) of FIG. 14 and, more specifically, to the portion of section 2 located between the line bus L100 and neutral bus N, there is provided a fuse F7 connected between the line bus L100 and a node 209. A filter 240 consisting of a capacitor C21 in series with a resistor R9, is connected between the node 209 and the neutral bus N. Filter 240 is designed to effectively short high-frequency arcing fault signals from line bus L100 to neutral bus N, thus preventing arcing fault signals on line bus L100 from crossing over to line bus L200. In completing the arcing fault signal path from line bus L100 to neutral bus N, the filter 240 accomplishes two functions. First, it prevents an arcing fault detector (not shown) on line bus L200 from detecting a "false" arcing fault signal on line bus L200. Second, it increases the signal strength at an arcing fault detector (not shown) positioned on line bus L100 on a load side of filter 240. Varistor V17 is connected between the node 209 and the neutral bus N. Varistor V17 provides a degree of surge protection for the isolation circuitry connected between the line bus L100 and the neutral bus N. A resistor R7 and a diode D12 are connected in series between the node 209 and a display 238.

Referring now to the remainder of the isolation circuitry (section 2) located between line bus L200 and neutral bus N, there is provided a fuse F8 connected between the line bus L 200 and a node 211. A filter 242 consisting of a capacitor C22 in series with a resistor R30 is connected between node 211 and the neutral bus N. Filter 242 is designed to complete the arcing fault signal path from line bus L200 to neutral bus N by effectively shorting high frequency arcing fault signals from the line bus L200 to neutral bus N. Thus, similar to the filter 240 described above, the filter 242 prevents an arcing fault detector (not shown) on line bus L100 from detecting a "false" arcing fault signal on line bus L100, and increases the signal strength at an arcing fault detector (not shown) positioned on line bus L200 on a load side of filter 242. A varistor V18 provides a degree of surge protection for the isolator circuitry connected between line bus L200 and neutral bus N. Resistor R8 is connected between node 211 and display 238.

Display 238 consists of a resistor R 32 connected in parallel with an LED 2. Display 238 provides a means for monitoring the operating status of the isolation circuitry. Should fuse F4 or F8 blow for any reason, causing a loss of isolator functionality, the LED2 will turn off. LED2 is visible through an opening 251 in the top wall 252 of the isolation module 222 (shown in FIG. 13).

Figure 15:
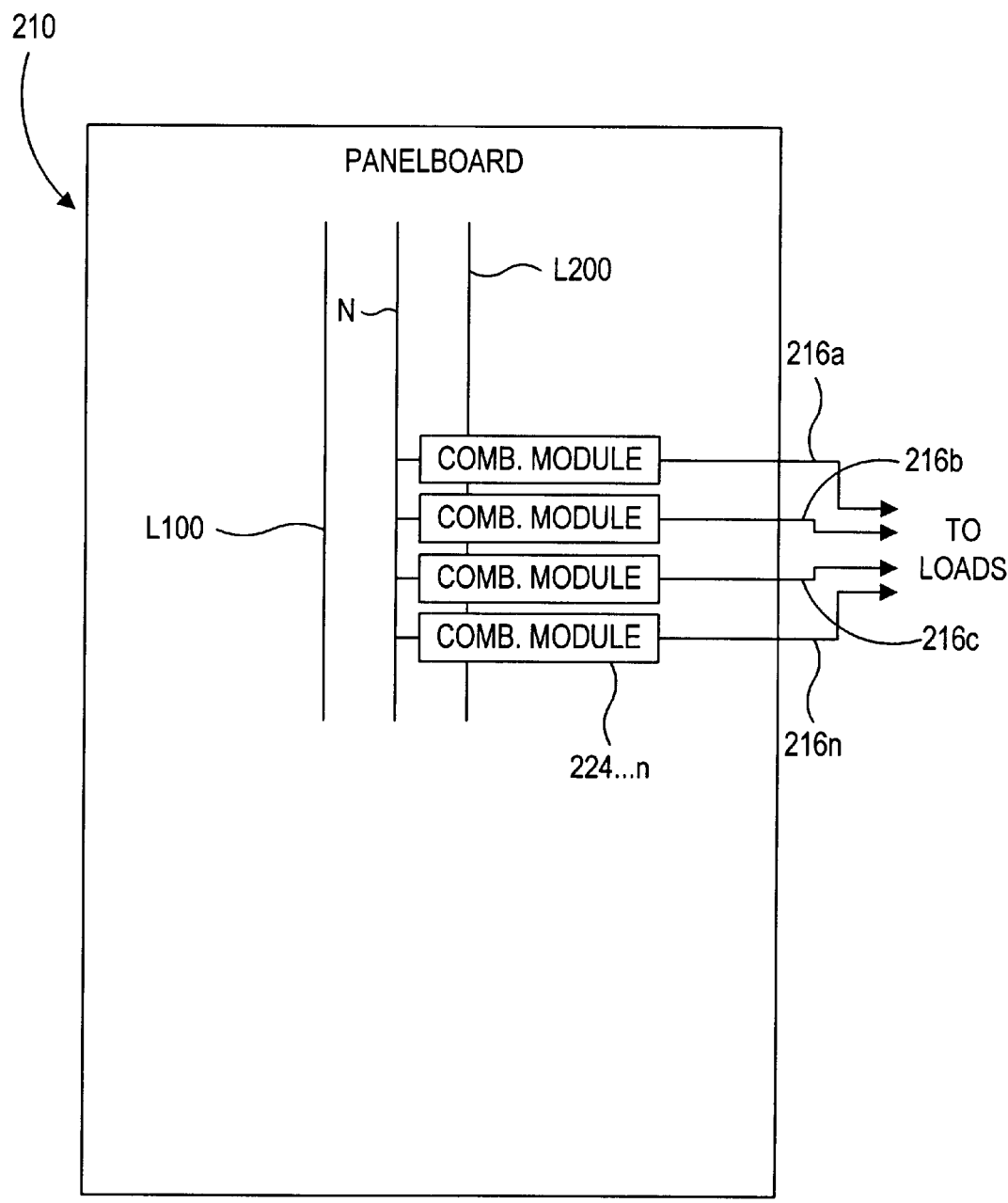
FIG. 15 is a block diagram of a panelboard including an integrated protection system with a combination module according to another embodiment of the present invention.
Figure 18:
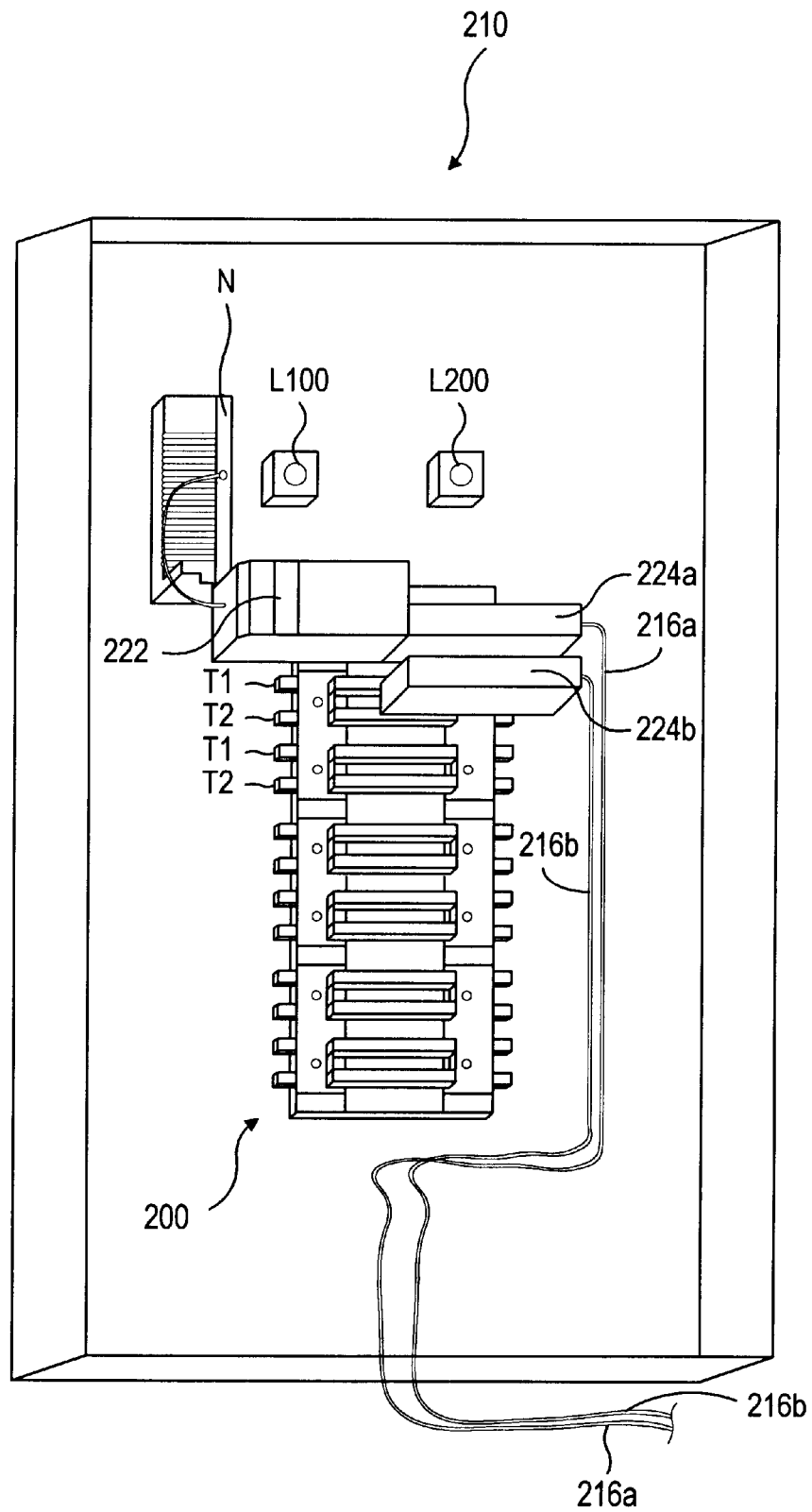
FIG. 18 is a perspective view of a panelboard including the integrated protection system of FIG. 15 with an isolation module at the distribution panel.

Referring now to FIG. 15, there is depicted a panelboard 210 including an integrated protection system according to another embodiment of the present invention. In this embodiment, the arcing fault detection and line interrupting functions described above are accomplished by combination arcing fault detector and line interrupter modules 224a, 224b, 224c . . . 224n (hereinafter "combination modules"). Each of the combination modules is associated with one of the branch circuits of the electrical distribution system and includes both arcing fault detection circuitry and a line interrupter. The combination modules 224a, 224b, 224c . . . 224n may be plugged onto or bolted to one of the line buses L100 or L200 as described in relation to FIG. 12, or they may be mounted separately within the panelboard 210 and connected to the line buses L100 or L200 by wire. As shown in FIG. 18, the integrated protection system may also include an isolation module 222 for electrically isolating arcing fault signals to the branch circuit on which they occurred, as described in relation to FIGS. 12–14. Branch isolation may also be achieved by isolation circuitry within the combination modules 224a, 224b, 224c . . . 224n. The isolation module 222 or combination modules 224a . . . n may also include surge protection circuitry to protect the line buses or either of the branch circuits from voltage surges.

In one embodiment, the combination module 224 comprises a circuit breaker with arcing fault detection capability. Alternatively, the combination module 224 comprises a relay, fuse, automatic switch or circuit breaker combined with an arcing fault detector. In either case, the combination module can include a test circuit (not shown), generally of the type described in relation to FIG. 1, which includes a test wire 82 coupled to the AFD sensor 21, and which periodically produces a current in the test wire 82 (e.g., a test signal) simulating series arcing faults, line-to-neutral arcing faults or line-to-ground arcing faults.

Figure 17:
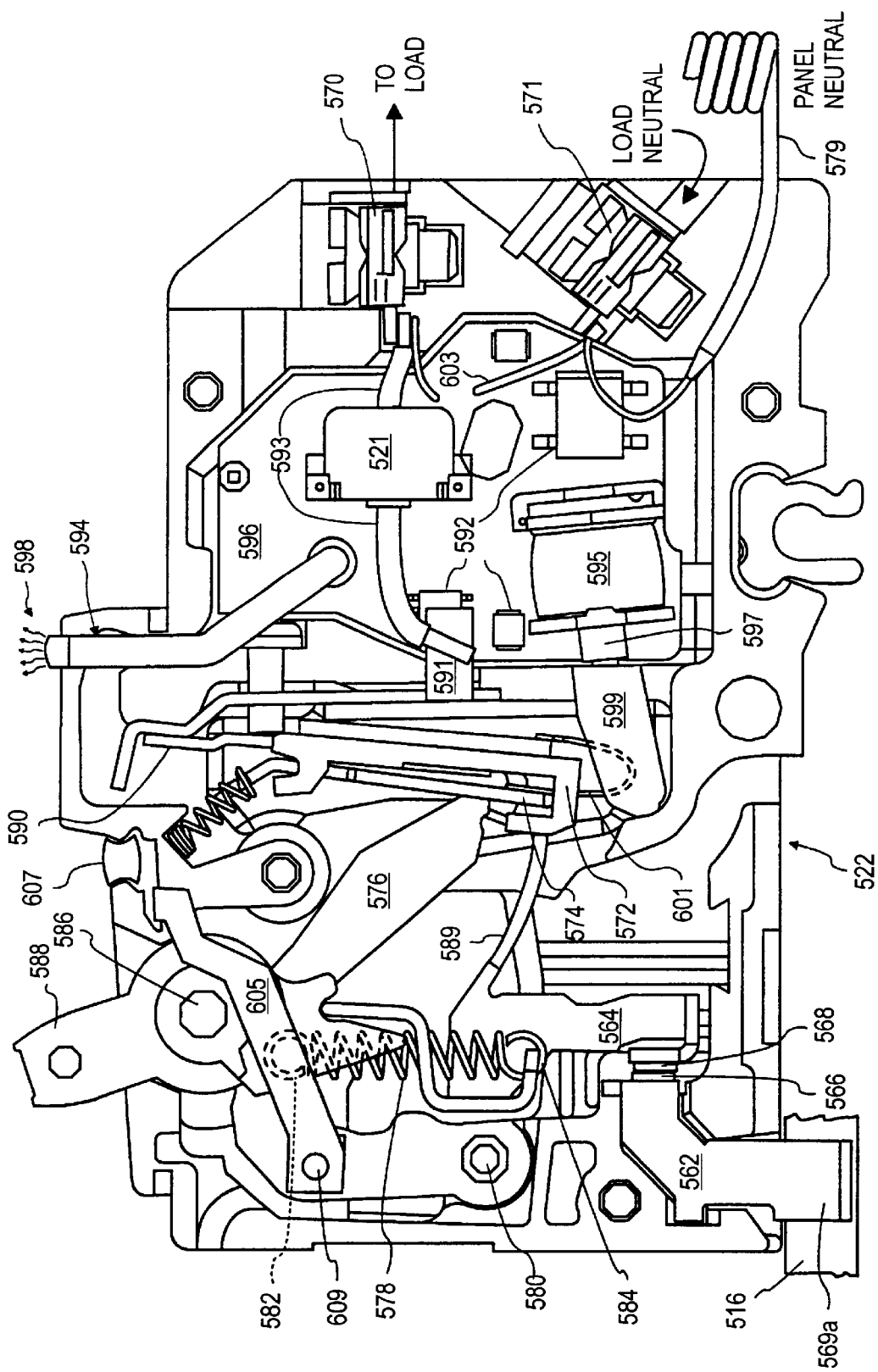
FIG. 17 is a top view of a combination module installed within the miniature circuit breaker housing of FIG. 16.

Turning now to FIG. 17, there is shown one embodiment of a combination module 224 including standard circuit breaker components and an arcing fault detection capability. The combination module 224 of FIG. 17 is adapted to be enclosed within a miniature circuit breaker housing 561 of the type shown in FIG. 16 and connected directly to the panelboard. In FIG. 17, the combination module 224 is in a closed position, enabling line current to flow completely through the module and toward a load center of a designated branch circuit. Line current enters the module 224 through the jaw-like terminal 569a and flows through a stationary contact carrier 562 integral with the terminal 569a. The stationary contact carrier 562 has a stationary contact 566 mounted thereon. When in the closed position, the stationary contact 566 abuts against a movable contact 568 which is mounted to a movable contact carrier 564. Line current thereby flows from the stationary contact carrier 562 to the movable contact carrier 564 through the stationary and movable contacts 566 and 568, respectively.

A pigtail conductor 589 is electrically connected at one end to the movable contact carrier 564 and at another end to a yoke 572, enabling line current to flow from the movable contact carrier 564 to the yoke 572 when the circuit breaker 522 is in a closed position. A bimetal conductor assembly 590 composed of two dissimilar thermostat materials is electrically connected to the yoke 572. The bimetal conductor assembly 590 includes a conductive plate 591 at one end which is electrically connected to an internal conductor 593. When the module 224 is in the closed position, electrical current flows from the yoke 572 through the bimetal conductor assembly 590 to the conductive plate 591 and through the internal conductor 593. Thereafter, current flowing through the internal conductor 593 passes through a sensing coil 521 substantially as described in relation to FIG. 1 which monitors the rate of change of electrical current flowing through the circuit breaker 522. After exiting the sensing coil 521, the line current flows to load terminal block 570 to which the load line conductor 583 (FIG. 16) may be attached to provide the line current to a load. The load terminal block 570 is defined by two conductive plates adapted to be clamped together by a screw. The load line conductor 583 may be attached by inserting it between two conductive plates and tightening the screw of the load terminal block 570.

The miniature circuit breaker 522 also includes a neutral terminal block 571 to which the load neutral conductor 585 (FIG. 16) may be attached in a similar fashion as the load line conductor 583 is attached to the load terminal block 570. The miniature circuit breaker further includes an internal neutral conductor 603 electrically connected at one end to the circuit board 596 and at another end to the panel neutral conductor 579 described in relation to FIG. 16. In embodiments with ground fault interruption (GFI) circuitry, the panel neutral conductor 579 is routed through the sensor 521 along with the internal line conductor 593 to permit sensing of an imbalance of current flow between the internal line and neutral conductors 593 and 603 as is known in the art. A more complete description of GFI circuitry is disclosed in U.S. Pat. No. 5,446,431, assigned to the instant assignee and incorporated herein by reference.

Figure 19:
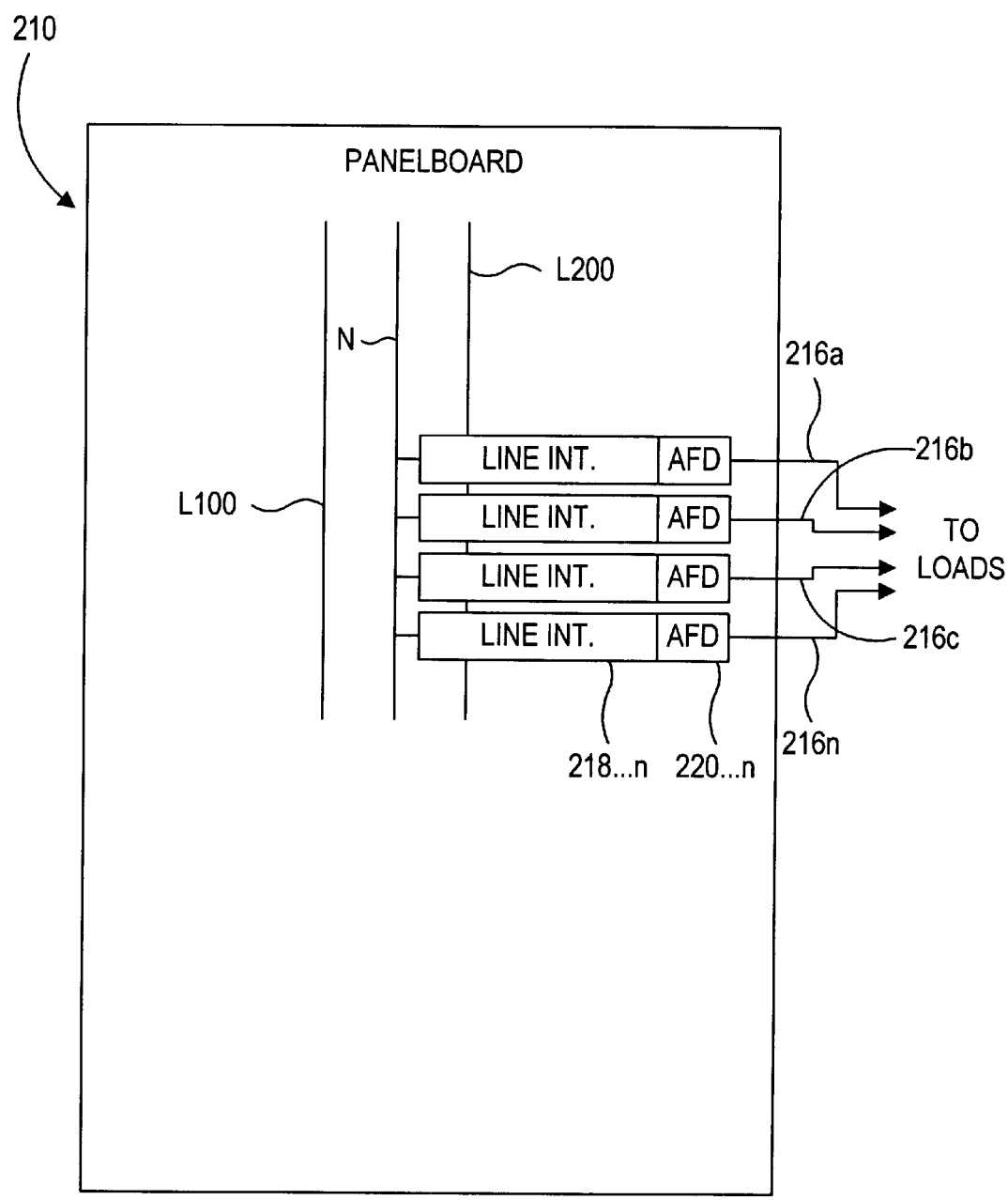
FIG. 19 is a block diagram of a panelboard including an integrated protection; system according to still another embodiment of the present invention.
Figure 20:
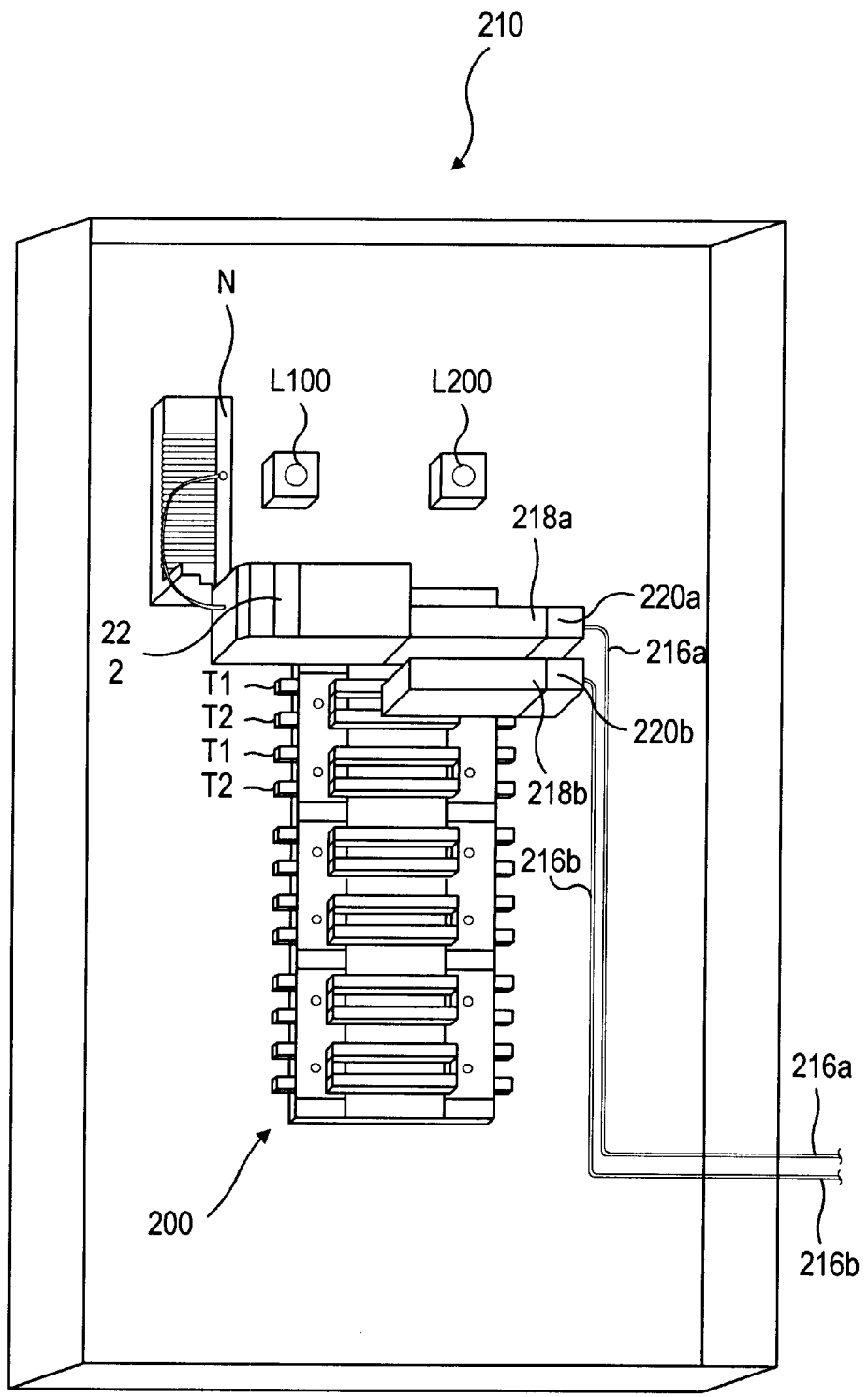
FIG. 20 is a perspective view of a panelboard including the integrated protection system of FIG. 19 with an isolation module at the distribution panel.

Now referring to FIGS. 18 and 19, there is depicted a panelboard 210 including an integrated protection system according to still another embodiment of the present invention. In this embodiment, the arcing fault detection and line interrupting functions described above are accomplished by separate arcing fault detector modules 220a, 220b, 220c . . . 220n and line interrupter modules 218a, 218b, 218c . . . 218n. However, in this embodiment, the arcing fault detector modules 220a, 220b, 220c . . . 220n are attached externally to the line interrupter modules 218a, 218b, 218c . . . 218n rather than being mounted to one of the positions in the panelboard 210. The line interrupter modules 218a, 218b, 218c . . . 218n may be plugged onto or bolted to one of the line buses L100 or L200 as shown in FIG. 9, or they may be mounted separately within the panelboard 210 and connected to one of the line buses L100 or L200 by wire.

In one embodiment, AFD modules 220 include a test circuit (not shown), generally of the type described in relation to FIG. 1, which includes a test wire 82 coupled to the AFD sensor 21, and which periodically produces a current in the test wire 82 (e.g., a test signal) simulating series arcing faults, line-to-neutral arcing faults or line-to-ground arcing faults. The integrated protection system may also include isolation module(s) 222 and/or branch isolation means substantially as described in relation to FIGS. 12–14. The isolation module(s) 222 or branch isolation means may also include surge protection circuitry to protect the line buses or either of the branch circuits from voltage surges.

While the present invention has been described with reference to one or more particular embodiments, those skilled in the art will recognize that many changes may be made thereto without departing from the spirit and scope of the present invention. Such variations are contemplated as falling within the spirit and scope of the claimed invention, as set forth in the following claims.

What is claimed is:

1. An arcing fault detection system for an electrical distribution network having a line and neutral conductor connected between a power source and a load, the arcing fault detection system comprising:

a single sensor coupled to the line conductor and responsive to series arcs, line-to-neutral arcs and line-to-ground arcs for monitoring a first derivative of electrical current carried by the line conductor and generating a sensor signal representing said first derivative of electrical current; and means for generating an arc-indicative signal in response to said sensor signal having characteristics indicative of any arcing fault producing series arcs, line-to-neutral arcs or line-to-ground arcs.

2. The system of claim 1 wherein the single sensor comprises a coil surrounding the line conductor and not the neutral conductor.

3. In an electrical distribution network including a panelboard for receiving and distributing power from a utility source to a plurality of branch circuits each including line and neutral conductors connected to a load, the panelboard defining a framework for electrically connecting circuit protection devices to said branch circuits, a circuit protection system comprising:

an arcing fault detection device connected to a first position in said framework, the arcing fault detection device including an internal line conductor electrically connected to the line conductor of one of the branch circuits;

a sensor coupled to the internal line conductor and responsive to series arcs, line-to-neutral arcs and line-to-ground arcs for monitoring a first derivative of electrical current carried by the internal line conductor and generating a sensor signal representing said first derivative of electrical current;

means for generating an arc-indicative signal in response to said sensor signal having characteristics indicative of any arcing fault producing series arcs, line-to-neutral arcs or line-to-ground arcs; and a line interrupter adapted to interrupt electrical current in the line conductor in response to the arc-indicative signal.

4. The system of claim 3 wherein the sensor comprises a coil surrounding the internal line conductor.

5. The system of claim 3 wherein the panelboard includes a line bus and a neutral bus for distributing said power to said branch circuits, the first position in said framework defining a position adjacent to and electrically connected to said line bus.

6. The system of claim 5 wherein the arcing fault detection device and the line interrupter are housed within a common module connected to said first position in said framework.

7. The system of claim 3 wherein the panelboard includes a line bus and a neutral bus for distributing said power to said branch circuits, the first position in said framework defining a position downstream from and electrically connected to said line bus.

8. The system of claim 7 wherein the arcing fault detection device is housed with in an arcing fault detection module connected to said first position in said framework, the line interrupter being connected to a second position in said framework upstream of said arcing fault detection module.

9. The system of claim 8 wherein the second position in said framework defines a position adjacent to and electrically connected to said line bus.

10. The system of claim 9 wherein the line interrupter is housed within a standard circuit breaker housing connected to said second position in said framework.

11. An arcing fault detection and testing system for an electrical distribution network having a line and neutral conductor connected between a power source and a load, the system comprising:

a single sensor coupled to the line conductor and responsive to series arcs, line-to-neutral arcs and line-to-ground arcs for monitoring a first derivative of electrical current carried by the line conductor and generating a sensor signal representing said first derivative of electrical current, a test wire coupled to said sensor;

means for producing a test signal on the test wire simulating any arcing fault producing series arcs, line-to-neutral arcs or line-to-ground arcs; and means for generating an arc-indicative signal in response to either of said sensor signal and test signal having characteristics indicative of an arcing fault producing any of said arcs.

12. The system of claim 11 wherein the single sensor comprises a coil surrounding the line conductor and test wire and not the neutral conductor.

13. The system of claim 11 wherein said test signal is a repetitive oscillating signal.

14. The system of claim 11 wherein said arcing-fault-detection signal is produced in response to the occurrence of signals having frequencies substantially above the frequency of the power signal, on said line conductor.

15. The system of claim 11 further comprising a signal generator connected to said test wire for producing said test signal.

16. The system of claim 15 wherein said test signal is an alternating signal having a frequency substantially above the frequency of the power signal.

17. The system of claim 16 wherein said test signal has a frequency above 60 Hz and below about 1 MHz.

18. In an electrical distribution network including a panelboard for receiving and distributing power from a utility source to a plurality of branch circuits each defining line and neutral conductors connected to a load, the panelboard defining a framework for electrically connecting circuit protection devices to said branch circuits, a circuit protection system comprising:

an arcing fault detection device connected to a first position in said framework, the arcing fault detection device including an internal line conductor electrically connected to the line conductor of one of the branch circuits;

a sensor coupled to the internal line conductor and responsive to series arcs line-to-neutral arcs and line-to-ground arcs for monitoring a first derivative of electrical current carried by the internal line conductor and generating a sensor signal representing said first derivative of electrical current;

a test wire coupled to said sensor;

means for producing a test signal on the test wire simulating an arcing fault producing series arcs, line-to-neutral arcs or line-to-ground arcs;

means for generating an arc-indicative signal in response to either of said sensor signal and said test signal having characteristics indicative of any arcing fault producing series arcs, line-to-neutral arcs or line-to-ground arcs; and a line interrupter adapted to interrupt electrical current in the line conductor in response to the arc-indicative signal.

19. The system of claim 18 wherein the sensor comprises a coil surrounding the internal line conductor and the test wire.

20. The system of claim 18 wherein the panelboard includes a line bus and a neutral bus for distributing said power to said branch circuits, the first position in said framework defining a position adjacent to and electrically connected to said line bus.

21. The system of claim 20 wherein the arcing fault detection device and the line interrupter are housed within a common module connected to said first position in said framework.

22. The system of claim 18 wherein the panelboard includes a line bus and a neutral bus for distributing said power to said branch circuits, the first position in said framework defining a position downstream from and electrically connected to said line bus.

23. The system of claim 22 wherein the arcing fault detection device is housed within an arcing fault detection module connected to said first position in said framework, the line interrupter being connected to a second position in said framework upstream of said arcing fault detection module.

24. The system of claim 23 wherein the second position in said framework defines a position adjacent to and electrically connected to said line bus.

25. The system of claim 24 wherein the line interrupter is housed within a standard circuit breaker housing connected to said second position in said framework.

26. A method of detecting arcing faults in an electrical distribution system that includes a line conductor connected to a utility power transformer, said method comprising the steps of:

monitoring a first derivative of electrical current carried by the line conductor with a single sensor and generating a sensor signal representing said first derivative of electrical current and responsive to series arcs, line-to-neutral arcs and line-to-ground arcs; and generating an arc-indicative signal in response to said sensor signal having characteristics indicative of any arcing fault producing series arcs, line-to-neutral arcs or line-to-ground arcs.

27. The method of claim 26 further comprising the step of periodically applying a test signal to said sensor through a test line, the test signal simulating a line current produced by an arcing fault, said sensor simultaneously monitoring the test signal and the electrical signal when the test signal is present on said test line, the arcing fault detection system generating an arc-indicative signal in response to the sensor signal associated with either of said test line or said line conductor having characteristics indicative of an arcing fault selected from the group consisting of series arcs, line-to-neutral arcs and line-to-ground arcs.

28. The method of claim 27 further comprising the step of generating a trip signal to trigger the interruption of the electrical signal on said line conductor, the step of generating a trip signal being accomplished when said test signal is not present on said test line and said arc-indicative signal was produced in response to the sensor signal representing both said test signal and said electrical signal.

29. The method of claim 28 wherein the step of generating a trip signal is further accomplished when said test signal is present on said test line and said arc-indicative signal was not produced in response to the sensor signal representing both said test signal and said electrical signal.

30. The test method of claim 28 wherein the step of generating a trip signal is inhibited when said test signal is present on said test line and said arc-indicative signal is produced in response to the sensor signal representing both said test signal and said electrical signal.

31. A testing apparatus for an arcing fault detection system in an electrical distribution network having a line conductor carrying an electrical signal between a power source and a load, said arcing fault detection system including a sensor coupled to said line conductor for monitoring said electrical signal and generating a sensor signal representing said electrical signal, said arcing fault detection system generating an arc-indicative signal in response to said sensor signal having characteristics indicative of an arcing fault, said testing apparatus comprising:

a test line coupled to said sensor simultaneously with said line conductor, and means for periodically producing a test signal on said test line, said sensor simultaneously monitoring said test signal and said electrical signal when said test signal is present on said test line, said sensor signal representing both said test signal and said electrical signal when said test signal is present on said test line, said arcing fault detection system generating an arc-indicative signal in response to said sensor signal associated with either of said test line or said line conductor having characteristics indicative of an arcing fault.

32. The testing apparatus of claim 31 further comprising a diagnostic test integrator for evaluating status conditions of said test signal and said arc-indicative signal and generating a trip signal to trigger the interruption of the electrical signal in response to certain status conditions of said test signal and said arc-indicative signal.

33. The testing apparatus of claim 32 wherein said diagnostic test integrator generates said trip signal when said test signal is not present on said test line and said arc-indicative signal was produced in response to the sensor signal representing both said test signal and said electrical signal.

34. The testing apparatus of claim 32 wherein said diagnostic test integrator generates said trip signal when said test signal is present on said test line and said arc-indicative signal was not produced in response to the sensor signal representing both said test signal and said electrical signal.

35. The testing apparatus of claim 32 wherein said diagnostic test integrator does not generate said trip signal when said test signal is present on said test line and said arc-indicative signal is produced in response to the sensor signal representing both said test signal and said electrical signal.

36. A testing apparatus for an arcing fault detection system in an electrical distribution network having a line and neutral conductor carrying an electrical signal between a power source and a load, said arcing fault detection system including a sensor coupled to said line conductor for monitoring said electrical signal and generating a sensor signal representing said electrical signal, said arcing fault detection system generating an arc-indicative signal in response to said sensor signal having characteristics indicative of an arcing fault, said testing apparatus comprising:

a test circuit removably attachable to said line and neutral conductor, said test circuit being adapted to produce a simulated arcing fault signal when attached to said line and neutral conductor, said sensor being adapted to monitor said simulated arcing fault signal and generate said sensor signal representing said simulated arcing fault signal, said arcing fault detection system generating an arc-indicative signal in response to said sensor signal associated with said simulated arcing fault signal having characteristics indicative of an arcing fault.

37. The testing apparatus of claim 36 wherein said test circuit comprises:

a first terminal removably attachable to said line conductor;

a second terminal removably attachable to said neutral conductor;

a relay comprising an electrical switch and a relay coil connected between the first and second terminals, the electrical switch rapidly opening and closing to create said simulated arcing fault signal when said first and second terminals are attached to said line and neutral conductors.

\* \* \* \* \*